US 8,219,956 B2

(12) United States Patent
Huynh et al.

(10) Patent No.: US 8,219,956 B2
(45) Date of Patent: *Jul. 10, 2012

(54) ANALOG TILE SELECTION, PLACEMENT, CONFIGURATION AND PROGRAMMING TOOL

(75) Inventors: Steven Huynh, Fremont, CA (US);
Matthew A. Grant, Palo Alto, CA (US);
Gary M. Hurtz, Pleasanton, CA (US);
David J. Kunst, Cupertino, CA (US);
Trey A. Roessig, Palo Alto, CA (US)

(73) Assignee: Active-Semi, Inc. (VG)

( * ) Notice: Subject to any disclaimer, the term of this patent is extended or adjusted under 35 U.S.C. 154(b) by 565 days.

This patent is subject to a terminal disclaimer.

(21) Appl. No.: 12/322,400

(22) Filed: Jan. 30, 2009

(65) Prior Publication Data

US 2010/0199250 A1 Aug. 5, 2010

(51) Int. Cl.
*G06F 17/50* (2006.01)

(52) U.S. Cl. ........................................ 716/119; 716/120

(58) Field of Classification Search ........... 716/118–123
See application file for complete search history.

(56) References Cited

U.S. PATENT DOCUMENTS

| | | | |
|---|---|---|---|
| 5,157,618 A | 10/1992 | Ravindra et al. | 716/50 |
| 7,024,649 B2 | 4/2006 | Collmeyer et al. | 716/139 |
| 7,080,265 B2 | 7/2006 | Thaker et al. | 713/300 |
| 7,373,629 B2 | 5/2008 | McGrath et al. | 716/121 |
| 7,394,445 B2 | 7/2008 | Chapuis et al. | 345/89 |
| 7,412,673 B1 | 8/2008 | Duong | 716/115 |
| 7,523,430 B1 | 4/2009 | Patel | 716/115 |
| 7,555,741 B1 | 6/2009 | Milton et al. | 716/101 |
| 7,581,198 B2 * | 8/2009 | Huynh et al. | 716/119 |
| 7,595,655 B2 | 9/2009 | Hutchings et al. | 326/16 |
| 7,620,926 B1 | 11/2009 | Tuan | 716/138 |
| 7,646,382 B2 | 1/2010 | Chapuis et al. | 345/211 |
| 7,673,157 B2 | 3/2010 | Chapuis et al. | 713/300 |
| 7,804,504 B1 | 9/2010 | Agarwal | 345/505 |
| 7,863,930 B2 | 1/2011 | Nishioka | 326/39 |
| 7,886,261 B1 | 2/2011 | Irving et al. | 716/128 |

(Continued)

OTHER PUBLICATIONS

Faraday Technology, brochure, "IP Selection Guide", pub. Jul. 2008, downloaded from Internet Jan. 20, 2009, http://www.faraday-tech.com/downloadDoc/documentation/IPSelectionGuide_FTC-2008-08.pdf.

*Primary Examiner* — Jack Chiang
*Assistant Examiner* — Binh Tat
(74) *Attorney, Agent, or Firm* — Imperium Patent Works; Joesph S. Spano; Darien K. Wallace

(57) ABSTRACT

An Analog Tile Selection, Placement, Configuration and Programming (ATSPCP) tool communicates a power management characteristic query over a network. The query is displayed to a user on a webpage. The query is a solicitation for desired characteristics of a Power Management Integrated Circuit (PMIC). After receiving user requirements in a response to the query, the tool selects a number of power management integrated circuit tiles having pre-defined physical structures. The pre-defined structure of each tile includes a bus portion and a memory structure for storing configuring information for the tile. When combined in a Multi-Tile Power Management Integrated Circuit (MTPMIC), the bus portions of the selected tiles automatically form a standardized bus that accommodates all signal communication required for a functioning MTPMIC that meets the user requirements. The ATSPCP tool combines the physical layout data of each selected PMIC tile to form composite physical layout data for the overall MTPMIC.

25 Claims, 25 Drawing Sheets

U.S. PATENT DOCUMENTS

| | | | |
|---|---|---|---|
| 7,904,864 B2* | 3/2011 | Huynh et al. | 716/122 |
| 7,966,588 B1* | 6/2011 | Perry et al. | 716/100 |
| 2004/0199890 A1 | 10/2004 | Segami | 716/125 |
| 2006/0202714 A1 | 9/2006 | Hoang et al. | 326/38 |
| 2009/0132987 A1 | 5/2009 | Huynh et al. | 716/11 |
| 2009/0144688 A1 | 6/2009 | Uchino et al. | 716/12 |
| 2009/0288056 A1 | 11/2009 | Gitchev et al. | 716/12 |
| 2009/0315165 A1 | 12/2009 | Huynh et al. | 257/685 |
| 2009/0319959 A1 | 12/2009 | Huynh et al. | 716/1 |
| 2009/0319975 A1 | 12/2009 | Huynh et al. | 716/10 |
| 2010/0199246 A1 | 8/2010 | Huynh et al. | 716/8 |
| 2010/0199249 A1 | 8/2010 | Huynh et al. | 716/11 |
| 2010/0199250 A1 | 8/2010 | Huynh et al. | 716/11 |
| 2010/0199254 A1 | 8/2010 | Huynh et al. | 716/17 |
| 2010/0281448 A1 | 11/2010 | He | 716/6 |
| 2010/0325599 A1 | 12/2010 | Perry et al. | 716/122 |

* cited by examiner

ANALOG TILE SELECTION, PLACEMENT, CONFIGURATION AND PROGRAMMING (ATSPCP) TOOL COMMUNICATING WITH A USER OVER THE INTERNET

WEBPAGE
40

INPUT SOURCE INFORMATION

PRIMARY SOURCE TYPE

☑ BATTERY - SINGLE CELL LITHIUM
USER SELECTION
41

SECONDARY SOURCE TYPE

☑ WALL ADAPTOR
USER ENTRY 42
| 5V | SUPPLY VOLTAGE — INPUT VOLTAGE INFORMATION 43
| 1A | MAXIMUM CURRENT

POWER MANAGEMENT CHARACTERISTIC QUERY

FIG. 7A

WEBPAGE
44

POWER OUTPUT REQUIREMENT INFORMATION

| 3 | POWER SUPPLY OUTPUT CHANNELS

CHANNEL 1
| 5V | OUTPUT VOLTAGE — OUTPUT VOLTAGE INFORMATION 45
| 0.5A | MINIMUM CURRENT

CHANNEL 2
| 3.3V | OUTPUT VOLTAGE
| 0.5A | MINIMUM CURRENT

CHANNEL 3
| 2.5V | OUTPUT VOLTAGE
| 0.5A | MINIMUM CURRENT

POWER MANAGEMENT CHARACTERISTIC QUERY

FIG. 7B

POWER MANAGEMENT CHARACTERISTIC QUERY

WEBPAGE
/ 60

INTEGRATED CIRCUIT TILE OPTIONS

BUCK CONVERTER TILE    DESCRIPTION

| [3] | TYPE 1 | TRACKING AND STANDBY |
| [ ] | TYPE 2 | NO TRACKING, NO STANDBY |
| [ ] | TYPE 3 | TRACKING, NO STANDBY |

PROGRAMMABLE I/O TILE

| [2] | TYPE 1 | 4 INPUTS, 4 OUTPUTS |
| [ ] | TYPE 2 | 2 INPUTS, 2 OUTPUTS |

LOW DROP OUT REGULATOR TILE

| [ ] | TYPE 1 | NO TRACKING, NO STANDBY |
| [2] | TYPE 2 | TRACKING AND STANDBY |

MASTER TILE

| [1] | TYPE 1 | I2C COMPATABLE |
| [ ] | TYPE 2 | GPIO COMPATABLE |

BATTERY CHARGER TILE

| [1] | TYPE 1 | USB INPUT, NO ACTIVE PATH |
| [ ] | TYPE 2 | DUAL INPUT, ACTIVE PATH |

FIG. 8

GRAPHICAL REPRESENTATION OF SELECTED TILES

GRAPHICAL REPRESENTATION OF SELECTED TILES LOCATED ADJACENT
ONE ANOTHER IN A MULTI-TILE INTEGRATED CIRCUIT

| LIST OF AVAILABLE PARTS THAT MEET REQUIREMENTS | | | | WEBPAGE 80 |
|---|---|---|---|---|
| | PART # | DESCRIPTION | PRICE | LEAD TIME |
| ✓ | ABC-123 | 3 BUCK, 2 LDO, 2 I/O, 1 MASTER | $3.49 | 1 DAY |
| ☐ | ABD-100 | 1 LDO, 1 I/O, 1 MASTER | $1.49 | 4 WKS |
| ☐ | ABF-200 | 1 BOOST, 3 I/O, 1 MASTER | $3.49 | 2 DAY |

GRAPHICAL REPRESENTATION OF AVAILABLE PART OPTIONS

SELECTED AVAILABLE PART — WEBPAGE 81

GRAPHICAL REPRESENTATION OF SELECTED AVAILABLE PART OPTION

ANALOG TILE SELECTION, PLACEMENT, CONFIGURATION AND PROGRAMMING (ATSPCP) TOOL COMMUNICATING WITH A USER OVER THE INTERNET

DESIGN OF A PORTION OF A PC BOARD BASED ON RECORDED ARRANGEMENT

WEBPAGE 140

| MASTER TILE | | | | | | | | |
|---|---|---|---|---|---|---|---|---|
| INTERFACE | ☑ | I2C | | | | | | |
| FCLK | ☑ | 1.25 MHZ | ☐ | 1.00 MHZ | ☐ | 0.85 MHZ | ☐ | 0.7 MHZ |
| RESET TIMEOUT | ☑ | 260 MS | ☐ | 65 MS | ☐ | NONE | | |
| PUSH BUTTON | ☑ | YES | ☐ | NO | | | | |
| REF BYPASS | | YES | | | | | | |
| ON1 ENABLE | ☐ | REG1 | ☑ | REG2 | ☐ | REG3 | ☐ | NONE |
| ON1 POLARITY | ☐ | HIGH | ☑ | LOW | | | | |
| ON3 ENABLE | ☑ | REG1 | ☐ | REG2 | ☐ | REG3 | ☐ | NONE |
| ON3 POLARITY | ☑ | HIGH | ☐ | LOW | | | | |
| BUCK TILE - REG1 | | | | | | | | |
| STANDBY VOLT. | 2.5 | V | | | | | | |
| MODE | ☑ | PWM/PFM | ☐ | PWM | | | ☐ | 0.85 MHZ | ☐ | 0.7 MHZ |
| SWITCH FREQ. | ☑ | 2XFCLK | ☐ | 1XFCLK | | | | |
| PHASE | ☑ | 0DEG | ☐ | 90DEG | ☐ | 180DEG | ☐ | 270DEG |
| POK Q. NRSTO | ☑ | YES | ☐ | NO | | | | |
| FAULT INT. | ☐ | YES | ☑ | NO | | | | |
| TRACK ENABLE | ☐ | YES | ☑ | NO | | | | |
| AUTO TURN-ON | ☑ | YES | ☐ | NO | | | | |
| LDO TILE - REG1 | | | | | | | | |
| HIGH PSRR | ☑ | YES | ☐ | NO | | | | |
| ACTIVE OUT. DIS. | ☐ | YES | ☑ | NO | | | | |

SOLICIT CONTROL REQUIREMENT INFORMATION

FIG. 19A

| BUCK_1 REGISTER | 10010110 |
|---|---|
| BUCK_2 REGISTER | 00100110 |
| BUCK_3 REGISTER | 11101110 |
| LDO_1-2 REGISTER | 11001100 |
| LDO_3-4 REGISTER | 01010001 |
| I/O_1 REGISTER | 11011100 |
| I/O_2 REGISTER | 01001100 |
| MASTER REGISTER | 10100110 |
| CHARGER REGISTER | 10000100 |

GENERATE TILE CONFIGURATION INFORMATION

FIG. 19B

ANALOG TILE SELECTION, PLACEMENT, CONFIGURATION AND PROGRAMMING TOOL

TECHNICAL FIELD

The disclosed embodiments relate to the field of programmable power management integrated circuits, and more specifically to selecting power management integrated circuit tiles, placing and manipulating the tiles to form a proposed power management integrated circuit, configuring the integrated circuit and/or programming the integrated circuit to meet specific customer requirements.

BACKGROUND

FIG. 1 (Prior Art) is a diagram of system 1 involving a type of analog integrated circuit 2 and a microcontroller integrated circuit 3. Analog integrated circuit 2 is sometimes called a "Power Management Unit" or "PMU". It is desired to be able to design and fabricate such a PMU for a custom application in a small amount of time. The custom application may, for example, require that PMU 2 include a number of different types of analog circuits. The analog circuits may, for example, be derived from integrated circuit Silicon Intellectual Property (SIP) blocks such as those commercially available from Faraday Technology Corporation of Hsinchu, Taiwan.

The analog circuits are designed and laid out so that they pack together and are of irregular shapes as illustrated in FIG. 1. Parts of the analog circuits may be shared. One example of such an analog circuit is a voltage regulator. The voltage regulator might be configurable to output a selectable voltage. The voltage regulator might be configurable so that a current limit of the regulator can be changed. The various analog circuits of PMU 2 might be configurable such that if PMU 2 is configured in one fashion, then certain of the analog circuits are coupled to certain of the integrated circuit input/output (I/O) terminals, whereas if PMU 2 is configured in another fashion then the analog circuits are coupled to others of the I/O terminals. Each of the analog circuits of PMU 2 may, for example, be configurable so that it can be enabled or disabled. There are many ways that the various analog circuits of an analog integrated circuit such as PMU 2 may be designed to be configurable.

However, each PMU is a custom design, which is functionally limited to the analog circuits that comprise the specific design. Due to the irregular shapes of the analog circuits and the sharing of some analog circuits, considerable engineering effort is required to significantly alter the functional capability of a particular PMU. For example, a first customer may require four channels each outputting a controlled voltage of a different magnitude and a first design may be made to fulfill the requirement. A second customer may require eight channels each outputting a controlled voltage of a different magnitude. To fulfill the additional requirements of the second customer, additional voltage regulators may be added to the design for the first customer. Using existing analog circuit design techniques and SIP blocks, a separate design and significant engineering effort must be directed to meet the second requirement. The physical layout must be updated, new routing layers designed, and a revised memory structure designed to address each new regulator.

For the same reasons, considerable engineering effort is required to substitute an analog circuit of one type for an analog circuit of another type to achieve a similar function. For example, to replace a buck converter with a linear voltage regulator, detailed integrated circuit layout, routing, and lay-out issues must be resolved by a design engineer to generate physical layout data suitable for integrated circuit fabrication.

These limitations result in increased engineering costs and time to market for custom PMU solutions. Although, PMUs may be designed with a large range of functionality that may be largely disabled to meet a particular set of customer requirements, this approach leads to PMUs that are both costly and large. The PMUs typically include substantial circuitry that is not utilized in the end product.

SUMMARY

A Multi-Tile Power Management Integrated Circuit (MTPMIC) includes a plurality of programmable Power Management Integrated Circuit (PMIC) tiles of regular shape. The programmable PMIC tiles are placed adjacent one another. Each programmable PMIC tile has a shape that conforms to a rectangular grid of fixed pitch to simplify placement of the tiles in an original integrated circuit layout and to simplify the physical interchange of tiles in an existing layout. Each programmable PMIC tile includes a bus portion comprised of conductors capable of transmitting digital signals, analog signals, and power signals. Each bus portion also includes a link portion that connects the respective bus portions of tiles disposed adjacent one another to form a standardized bus. The standardized bus electrically and operatively connects each PMIC tile of a MTPMIC to every other PMIC tile in the MTPMIC. Furthermore, each PMIC tile contains writable registers of memory structures. Configuration information that configures the functional circuitry of the PMIC tile is stored in the PMIC tile itself in the writable configuration register of the PMIC. Each of these configuration registers of the MTPMIC is individually addressable and writable via the standardized bus.

In one novel aspect, an "Analog Tile Selection, Placement, Configuration and Programming" (ATSPCP) tool serves a webpage. The webpage is communicated across a network (for example, the Internet) to a remotely located user. The webpage includes a power management characteristic query. The user responds to the query (for example, using the user's web browser). The user response to the query is communicated back across the network to the ATSPCP tool. In response to receiving the user response, the ATSPCP tool selects a number of PMIC tiles. When combined in a MTPMIC and properly configured, these selected PMIC tiles are capable of meeting the user requirements derived from the user response. Once a layout of the selected PMIC tiles is decided upon by the user, the ATSPCP tool combines physical layout data of each of the selected PMIC tiles to form composite physical layout data for the overall MTPMIC. The ATSPCP is able to perform this combination operation automatically because there is no need for custom designed routing layers or memory features to realize the functional MTPMIC. Each of the selected PMIC tiles contains memory for storing the required tile configuration information to configure the PMIC tile. Moreover, the standardized bus that is formed when the PMIC tiles are disposed adjacent one another provides all required signal communication.

In a second novel aspect, the Internet-accessible ATSPCP tool communicates a graphical representation of a first PMIC tile in a first position with respect to a second PMIC tile. The graphical representation may, for example, be or include a rectangle that represents the boundaries of the first PMIC tile. The ATSPCP tools receives a first user response to the first graphical representation over the Internet. The first user response indicates a preference to move the second PMIC tile with respect to the first PMIC tile such that the two tiles abut one another. In response to the first user response, the ATSPCP tool sends a second graphical representation of the first PMIC tile in a second position with respect to the second PMIC tile over the Internet. The user views the first and second PMIC tiles in the new position. The user then indicates satisfaction with the second positioning of the two tiles by sending a second user response back to the ATSPCP tool. The ATSPCP tool receives a second user response and then generates physical layout data for an MTPMIC that contains the first PMIC tile in the second position with respect to the second PMIC tile.

Due to the regular shape of each PMIC tile, the placement and arrangement and rearrangement of individual PMIC tiles with respect to one another in an integrated circuit layout is greatly simplified. Tile placement may be accomplished by remote users with minimal training in analog circuit design using the ATSPCP tool. Users manipulate simplified graphical representations of PMIC tiles that are rendered by the users' web browsers. The simplified graphical representations do not contain detailed layout information of each tile and detailed layout information is not present on the users' computers. Due to the design of the tiles, there is no need for complex custom signal routing layers to connect the tiles. Placing the PMIC tiles adjacent one another forms the standardized bus. Accordingly, in response to a user response indicating satisfaction with a placement of PMIC tiles, the ATSPCP tool can generate physical layout data suitable for fabricating an integrated circuit that meets user requirements.

In a third novel aspect, the ATSPCP tool communicates a power management control characteristic query and receives a user response to the query from across a network. In response, the ATSPCP tool generates tile configuration information useable to configure PMIC tiles when the tile configuration information is stored in the configuration registers of each PMIC tile. An individual one of the writable configuration registers in a selectable one of the PMIC tiles can be loaded with tile configuration information to control tile operational characteristics. For example, an individual PMIC tile may include configurable analog circuitry such as a configurable battery charger circuit. The configurable battery charger circuit may be configured to have a selectable regulated output voltage, to have a selectable output current limit, and to be selectably disabled and enabled. An individual one of the writable registers in a selectable one of the PMIC tiles can be loaded with configuration information.

Each PMIC tile includes its own writable configuration registers. Configuration information stored in the writable configuration register of a PMIC tile controls the operational characteristics of the functional circuitry of the tile. By storing tile configuration information in each PMIC tile in such memory structures, a MTPMIC may easily be assembled without having to design a custom, centralized memory structure for each new MTPMIC design. Furthermore, there is no need to contemplate and adapt tile configuration information to this structure. For each tile, the function determined by the configuration information bit values stored in each writable configuration register is pre-determined. Thus, the ATSPCP tool can quickly and automatically generate tile configuration information useable to configure each PMIC tile for a new MTPMIC design based on the response to the power management control characteristic query.

In a fourth novel aspect, the ATSPCP tool communicates a power management control characteristic query and receives a user response to the query from across a network. In response to the user response, the ATSPCP tool programs the PMIC tiles that make up the MTPMIC. The memory structure of each PMIC tile is individually addressable via the standardized bus, which is formed when the selected tiles are placed together to form a proposed MTPMIC. Furthermore, the memory for storing tile configuration information for each PMIC tile is pre-determined and present in each individual tile. Thus, the ATSPCP tool quickly and automatically programs the tiles of the MTPMIC based on the response to the power management control characteristic query. The configuration information is communicated across the standardized bus to the various PMIC tiles being programmed. The programming can occur either at the location of the computer that executes the ATSPCP tool and/or at a remote location of the user.

In a fifth novel aspect, a programmable analog tile integrated circuit is configured over a standardized bus by communicating tile configuration information from a first PMIC tile, through a second PMIC tile, to a third PMIC tile. Each of the three PMIC tiles is part of an integrated circuit. Because the standardized bus is formed when the PMIC tiles are placed adjacent one another, the data bus and control signal conductors of the adjacent tiles line up and interconnect with one another in an appropriate manner so that each PMIC tile is electrically and operatively connected to every other PMIC tile. There is no need for complex, custom routing layers to direct tile configuration information from one tile to another. Tile configuration information may be written to a selected register in any selected one of the PMIC tiles using the data bus and control lines of the standardized bus, regardless of the relative physical locations of the PMIC tile sending and the PMIC tile receiving the information. Thus, tile configuration information may pass from one PMIC tile to another PMIC tile, through any number of intermediate PMIC tiles. The modular tile architecture and design tool described here shorten integrated circuit development times, and may allow a user of the architecture and ATSPCP tool to obtain design wins due to the user being able to design and provide a custom integrated circuit that meets specifications set by a prospective customer in a small amount of time as compared to more conventional integrated circuit design and layout techniques.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 7A-7C are diagrams illustrative of a power management characteristic query soliciting input source information, power output requirement information, and control I/O requirements, respectively, in accordance with the novel aspect of FIG. 6.

FIG. 8 is a diagram illustrative of integrated circuit tile options presented to the user in accordance with the novel aspect of FIG. 6.

FIGS. 19A-19B are diagrams illustrative of control requirement information and tile configuration information, respectively.

DETAILED DESCRIPTION

Reference will now be made in detail to some embodiments of the invention, examples of which are illustrated in the accompanying drawings.

Figure 1:
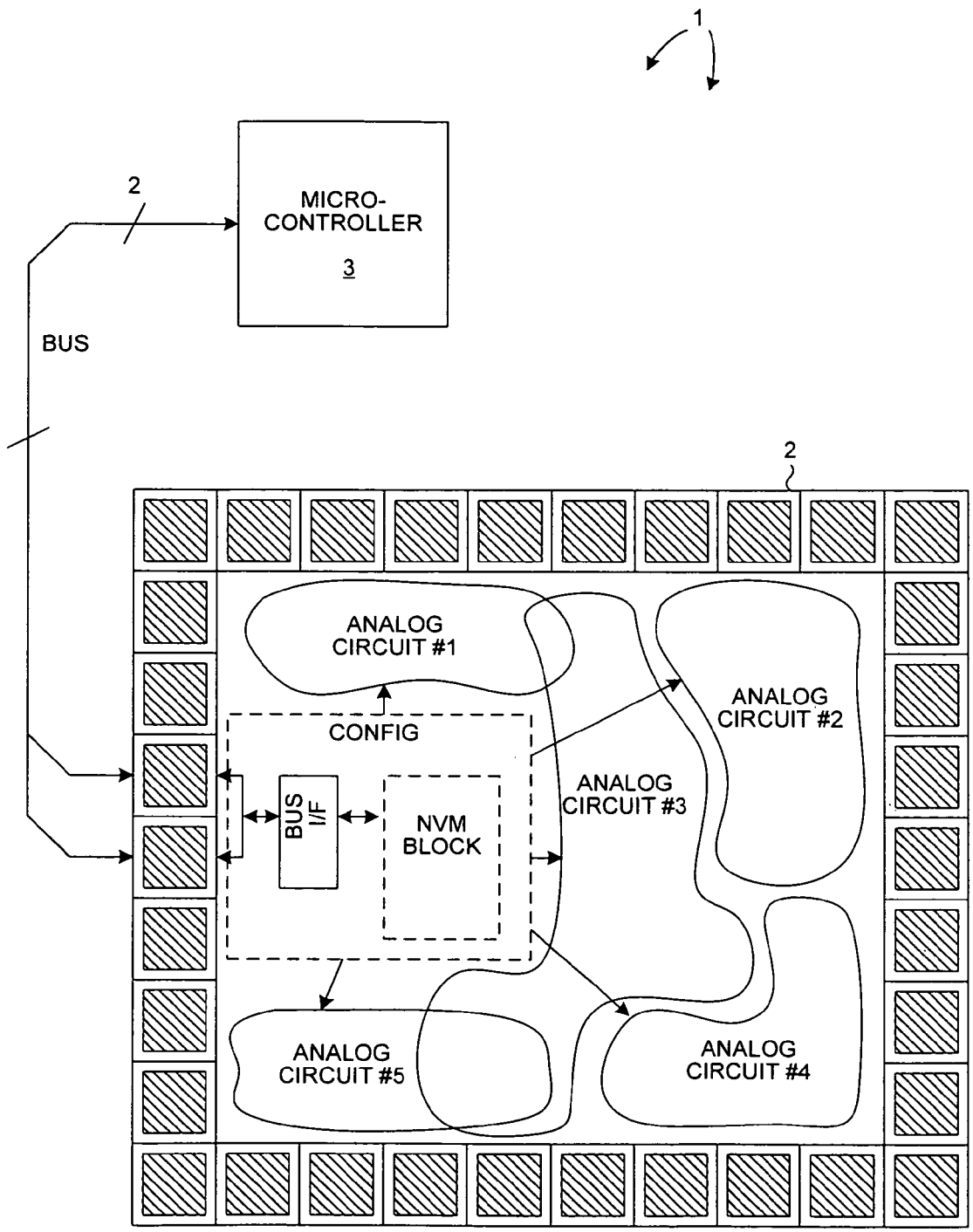
FIG. 1 (prior art) is a diagram illustrative of a conventional Power Management Unit (PMU).
Figure 2:
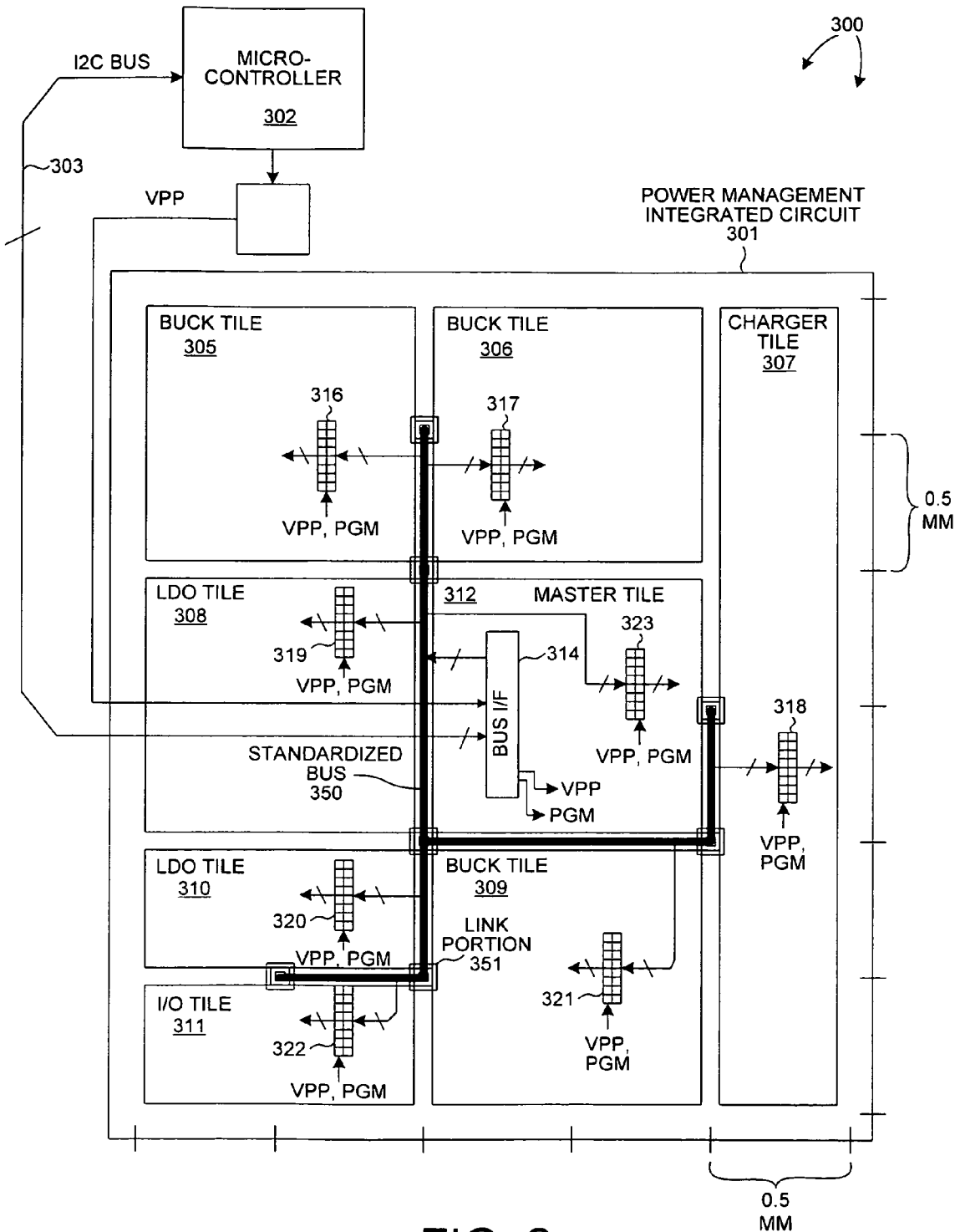
FIG. 2 is a diagram illustrative of a Power Management Integrated Circuit (PMIC) comprised of novel PMIC tiles. The boundaries of the PMIC tiles conform to a layout grid. The PMIC tiles include pre-defined memory structures and bus portions which automatically connect to form a standardized bus when PMIC tiles are placed adjacent one another.

FIG. 2 is a diagram of a system 300. System 300 includes a Power Management Integrated Circuit (PMIC) 301, a microcontroller integrated circuit 302, and a bus 303. A PMIC is set forth as an example of one type of integrated circuit that can advantageously employ an "Analog Tile Selection, Placement, Configuration and Programming" (ATSPCP) tool as set forth in this patent document. It is to be understood that a PMIC is just one example of many types of integrated circuits that may be designed, selected and/or configured using the ATSPCP tool. Other examples include a Light Management Unit (LMU), an Energy Processing Unit (EPU), and a Power Management Unit (PMU), however, this list is not meant to be exhaustive.

PMIC 301 includes a selection of regularly shaped integrated circuit tiles 305-312 placed adjacent one another. Each tile is shaped to conform to a rectangular grid of fixed pitch to simplify placement of the tiles in an original integrated circuit layout and to simplify the physical interchange of tiles in an existing layout. Tiles 305, 306, and 309 are referred to as "buck converter" tiles and each has a voltage step-down power management function. Tiles 308 and 310 are referred to as "low drop out regulator (LDO)" tiles and each has a voltage regulation function. Tile 311 is referred to as an "input/output (I/O)" tile, which has a signal interface function between the PMIC 301 and its package. Tile 307 is referred to as a "battery charger" tile that has a power supply function. Tile 312 is referred to as a "master tile". Master tile 312 includes a bus interface block 314 and a register of memory structures 323 useable to configure functional circuitry of the master tile. For example, functional circuitry of the master tile 312 may include a voltage reference generator and a clock. The clock signal and the signals generated by the voltage reference generator are communicated to the other tiles. Other examples of integrated circuit tiles include boost converter tiles which have a step-up power management function, charge pump tiles which have a power supply function, battery and power path management tiles which manage the power supply to multiple devices, switching power controller tiles which control the operation of switched mode power supplies, and lighting control module tiles which supply power to direct current (DC) lighting devices, data converter tiles, to achieve, for example, analog-to-digital or digital-to-analog signal conversion, microcontroller and microprocessor tiles, interface tiles featuring, for example, USB interfacing capability, and supervisory tiles, for example, a watchdog function for quantities such as voltage, temperature, etc.

These tiles may be simply arranged adjacent one another in an integrated circuit layout because each tile shares a regular shape that conforms to a rectangular grid of fixed pitch, for example, 0.5 millimeters. The PMIC layout illustrated in FIG. 2 illustrates a simple arrangement of tiles disposed on a regular grid.

For additional detail on the tile architecture, and how the tiles interconnect and intercommunicate, and how the tiles can be programmably configured, see: 1) U.S. Pat. No. 7,788,608, entitled "Microbump Function Assignment In A Buck Converter", filed Oct. 29, 2007, by Huynh et al.; 2) U.S. Pat. No. 7,581,198, entitled "Method and System for the Modular Design and Layout of Integrated Circuits", filed Oct. 7, 2006, by Huynh et al.; 3) U.S. provisional application 60/850,359, entitled "Single-Poly EEPROM Structure For Bit-Wise Write/Overwrite", filed Oct. 7, 2006; 4) U.S. Pat. No. 7,869,275, entitled "Memory Structure Capable of Bit-Wise Write or Overwrite", filed Jul. 31, 2007, by Grant et al.; and 5) U.S. Pat. No. 7,904,864, entitled "Interconnect Layer of a Modularly Designed Analog Integrated Circuit", filed Oct. 29, 2007, by Huynh et al; 6) U.S. patent application Ser. No. 11/452,713, entitled "System for a Scaleable and Programmable Power Management Integrated Circuit", filed Jun. 13, 2006, by Huynh; and 7) U.S. provisional application Ser. No. 60/691,721, entitled "System for a Scaleable and Programmable Power Management Integrated Circuit", filed Jun. 16, 2005, by Huynh (the entire subject matter of each of these patent documents is incorporated herein by reference).

Figure 3:
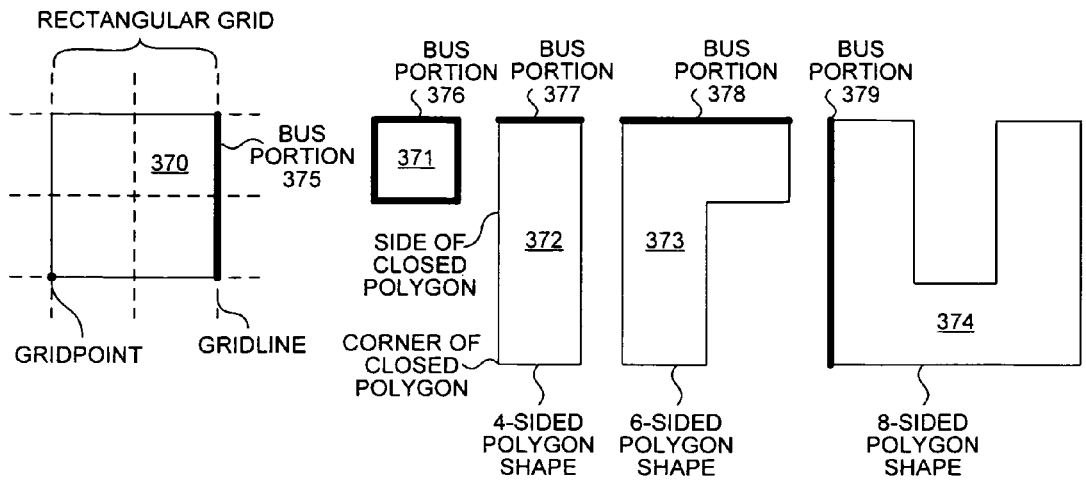
FIG. 3 is a diagram illustrative of some possible shapes of PMIC tiles.

FIG. 3 is a diagram illustrative of possible, general shapes of tiles. Tiles 370-374 are not an exhaustive list of possible tile shapes, but rather are simply illustrative examples. For example, tile 370 is an example of a four-sided polygon shaped tile, tile 373 is an example of a six-sided polygon shaped tile, and tile 374 is an example of an eight-sided polygon shaped tile. In general, each tile shape is closed polygon wherein each corner of the closed polygon lies on or substantially near a gridpoint of a rectangular grid of fixed pitch. In addition, each side of the closed polygon lies on or substantially near gridlines, which connect each gridpoint of the rectangular grid of fixed pitch. Following these geometric rules, a wide variety of tile shapes may be composed and a plurality of these shapes can be assembled into MTPMICs.

Referring back to FIG. 2, each of the tiles 305-312 includes registers of memory structures 316-323. In the simplified illustration of FIG. 2, each tile is illustrated to include one eight-bit register of memory structures. These registers are designated with reference numerals 316-323. However, each memory structure may include either more or less bits. Each memory structure may be comprised of volatile bits, non-volatile bits, or a combination of volatile and non-volatile bits. For additional detail on one suitable memory structure, see: U.S. Pat. No. 7,869,275, filed Jul. 31, 2007 (the entire subject matter of which is incorporated herein by reference).

Each tile contains its own configuration registers of known characteristics, for example bit structure, address, and function of each selectable bit value of each register. Each tile does not have to rely on external memory to function as part of PMIC 301. It is not necessary to design a custom, centralized memory structure for PMIC 301. Thus, design modifications can be made to a PMIC without having to design a new memory structure and address structure to store configuration information. Instead, a predefined memory structure and address exists for each tile. Tile configuration information including a register address and bit configuration information for the register can be generated automatically once a particular tile function for the tile within the PMIC has been defined. Each of the tiles 305-312 is electrically connected to each other by a standardized bus 350. Each of tiles 370-374 illustrated in FIG. 3 also includes a respective bus portion 375-379, which lies along or substantially near at least one side of a closed polygon shape tile.

Figure 4:
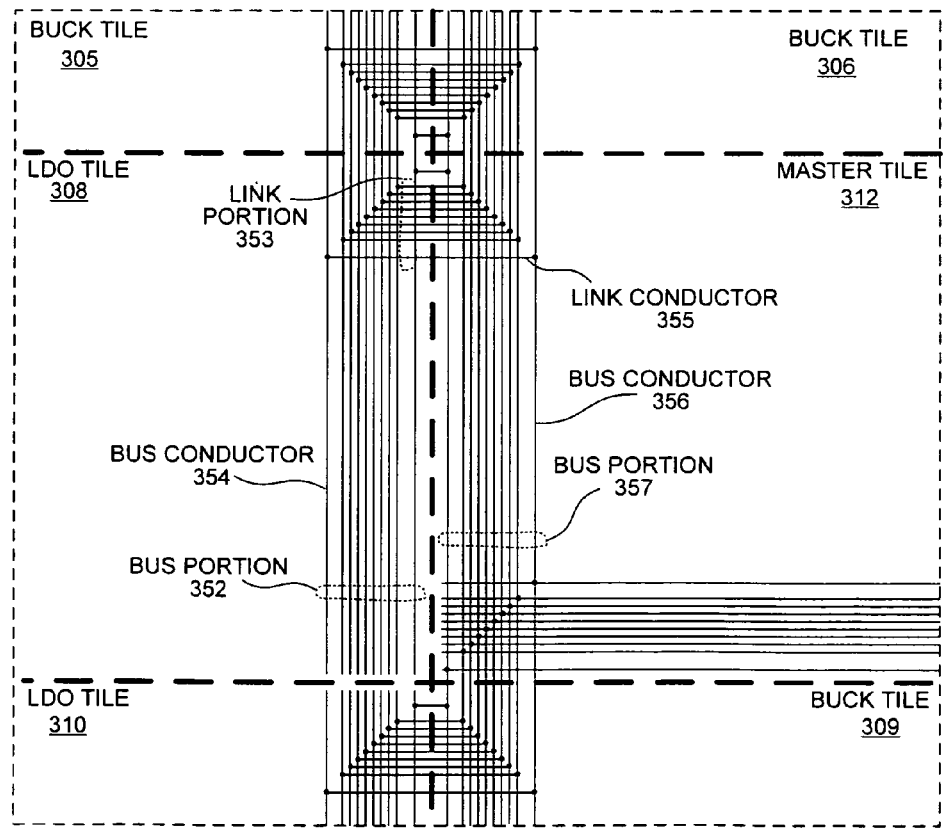
FIG. 4 is a diagram illustrative of the details of the connection of bus portions of multiple PMIC tiles to form a standardized bus.

FIG. 4 is a diagram illustrative of the details of the formation of a portion of the standardized bus 350 when buck tile 305, buck tile 306, master tile 313, LDO tile 308, LDO tile 310, and buck tile 310 are disposed adjacent one another in an integrated circuit layout. LDO tile 308 includes a bus portion 352, which includes a plurality of bus conductors such as bus conductor 354 and a link portion 353. Link portion 353 includes a plurality of link conductors such as link conductor 355. When LDO tile 308 is disposed adjacent master tile 312, link conductor 355 electrically connects bus conductor 354 of LDO tile 308 with the corresponding bus conductor 356 of master tile 312. Analogously, each bus conductor of the bus portion 352 of LDO tile 308 is electrically connected to each corresponding bus conductor of the bus portion 357 of master tile 312 via link portion 353. In this manner a standardized bus 350 is formed by simply placing tiles adjacent one another in an integrated circuit.

In one embodiment, a functional MTPMIC is created utilizing the conductors of the standardized bus alone without any additional signal routing layers. Because the placement of tiles adjacent one another in an integrated circuit dictates the standardized bus structure and because the physical layout data of each tile is pre-determined, physical layout data for a functional MTPMIC useable for IC fabrication may be quickly and automatically generated by the ATSPCP tool after placement of the tiles in a proposed MTPMIC.

The standardized bus may include dedicated signal conductors, communication signal conductors, control signal conductors, and power supply and ground conductors. For example, the standardized bus may include seventy distinct conductors. Some contemplated control, communication, and power supply signals include, but are not limited to: (a) "committed", fixed-purpose signals such as, without limitation, voltage references and voltage sources, current references and current sources, oscillator signals, clock timing and synchronization signals, data and address signals for programming and communication, analog or digital electrical trimming signals, various ground signals including analog ground, digital ground, and signal ground sense, various power supply signals including analog core power supply, digital core power supply, I/O power supply, and Non-Volatile Memory (NVM) programming power supply, as well as (b) "uncommitted" analog and/or digital signals, which can be claimed by one or more tiles for inter-tile connections, control, and/or communication. In some embodiments, at least one of the tiles is configured to control an electrical and/or performance characteristic at least in part based on information stored in its memory. In some other embodiments of the present invention, at least one of the tiles is configured to generate a voltage reference and/or clock signal(s) that are operable for use by at least one of the other tiles.

Figure 5:
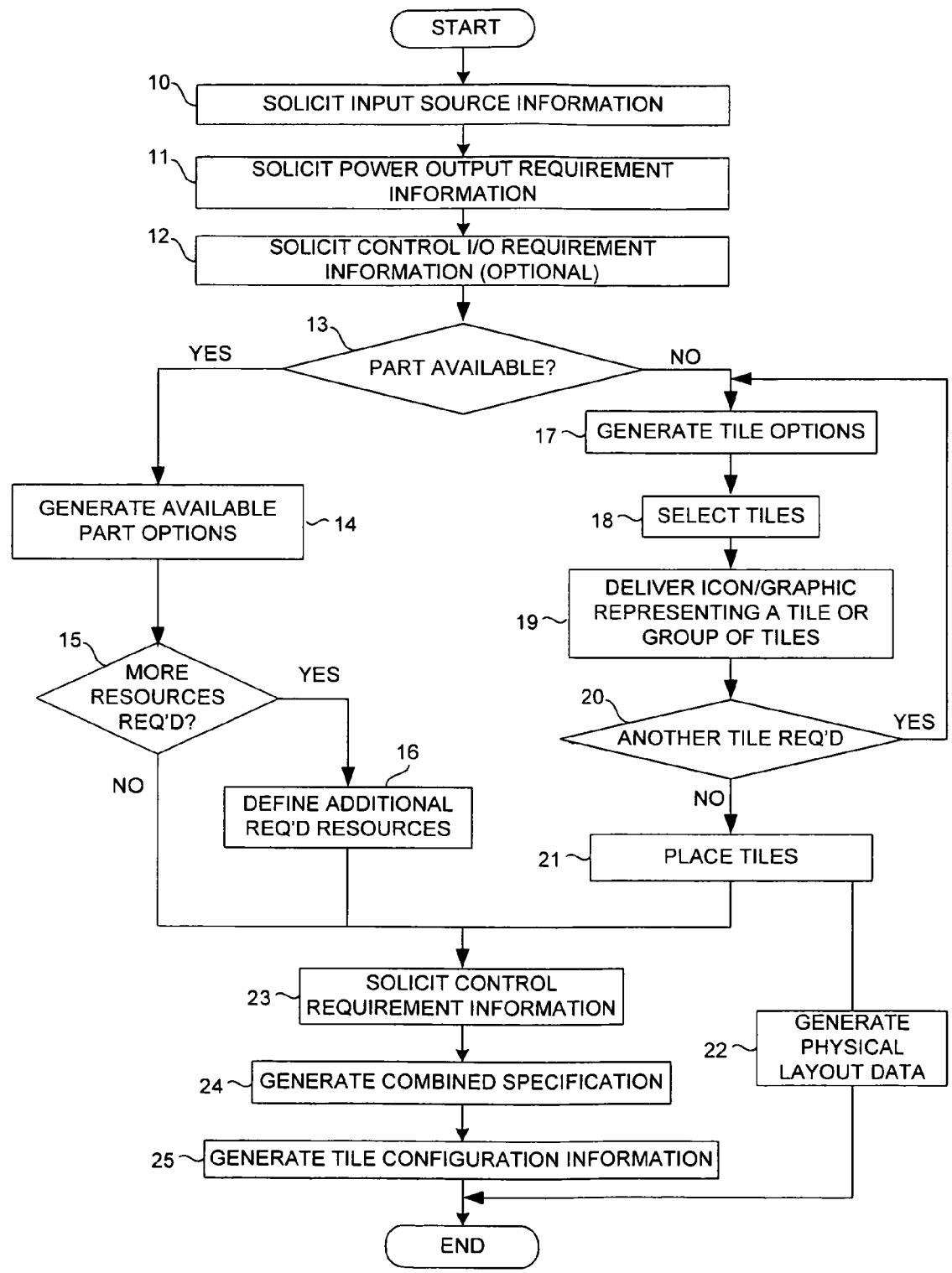
FIG. 5 is a simplified flowchart of an operation of a novel Analog Tile Selection, Placement, Configuration and Programming (ATSPCP) tool. User requirements are solicited, and PMIC tiles are selected, placed, configured and programmed to meet the user requirements.

FIG. 5 is a flowchart illustrative of an operation of an "Analog Tile Selection, Placement, Configuration and Programming" (ATSPCP) tool 46. Operational steps include selecting power management integrated circuit tiles, placing the selected tiles in a proposed integrated circuit, generating a combined specification for the proposed integrated circuit, generating tile configuration information to program the selected tiles of the proposed integrated circuit, and actually programming the tiles of the proposed integrated circuit. The process begins by soliciting input source information (step 10), soliciting power output requirement information (step 11), and optionally, soliciting control I/O requirement information (step 12). The information solicited is then used to evaluate (step 13) whether an available part meets or substantially meets the requirements informed by the information solicited in steps 10-12. If it is determined in step 13 that at least one part is available, then available part options are generated (step 14). Each of these options is evaluated (step 15) to determine if the option meets the requirements informed by the information solicited in steps 10-12, or if additional resources are required. If additional resources are required, then these additional resources are defined (step 16) such that the available part option and the additional resources meets the requirements informed by the information solicited in steps 10-12. If it is determined that no part is available that meets or substantially meets the requirements informed by the information solicited in steps 10-12, then individual tile options are generated (step 17), which fulfill a portion of the requirements informed by the information solicited in step 10-12. A selection of these individual tiles is made (step 18) and an icon/graphic representing the selected tile or group of tiles is delivered (step 19). The selection of these individual tiles is then evaluated (step 20) to determine if another tile is required to meet the requirements informed by the information solicited in step 10-12. If another tile is required, then the process of steps 17-20 is iteratively repeated beginning at the step 17. If the selection of tiles is determined to meet the requirements informed by the information solicited in steps 10-12, then the tiles are placed (step 21) in a proposed integrated circuit. Because of the novel tile and standardized bus architecture described above, physical layout data can be generated (step 22) quickly and automatically after tiles are placed in a proposed integrated circuit.

In one example, GDS II layout data for each of the selected tiles is retrieved from a library of GDS II tile layout data. The GDS II data describes the structure of the various layers of the tile. The retrieved GDS II data for the selected tiles is then combined to generate an amount of composite GDS II layout data for the proposed multi-tile integrated circuit. At this point, an integrated circuit comprised of PMIC tiles has been determined.

Control requirement information is solicited (step 23) to determine the programming requirements for the proposed integrated circuit. Based on the control requirement information solicited, a combined specification for the proposed integrated circuit is generated (step 24). Tile configuration information useable to program each PMIC tile of the MTPMIC is generated (step 25). In one example, a (Universal Serial Bus) USB bus dongle 50 is provided. USB dongle 50 has a socket or other mechanism for making electrical and physical contact with the MTPMIC 51 to be programmed. One end of dongle 50 is inserted into a USB port 52 of the computer 30 that executes ATSPCP tool 46. The unprogrammed MTPMIC 51 is inserted into the socket at the other end of the dongle. ATSPCP tool 46, after determining the configuration information as explained above, communicates the configuration information through USB port 52, through USB dongle 50, and into MTPMIC 51, into the master tile, and through the standardized bus on the MTPMIC to the appropriate configuration registers in the various PMIC tiles, thereby programming and configuring the various PMIC tiles. The MTPMIC 51 can be repeatedly reprogrammed in different ways using dongle 50 if desired.

Figure 6:
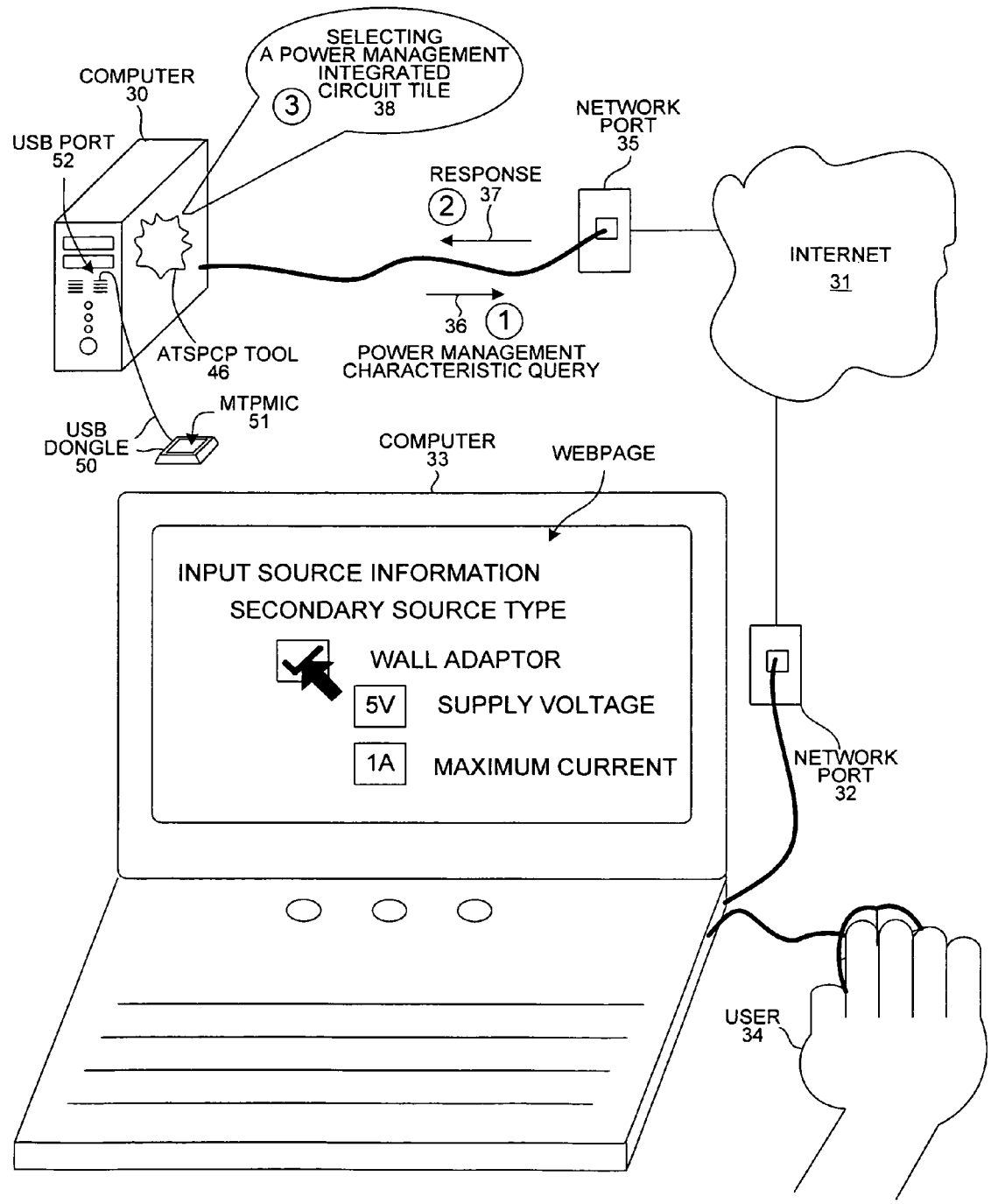
FIG. 6 is a diagram illustrative of system and method involving the ATSPCP in one novel aspect.

FIG. 6 is a diagram illustrative of a preferred embodiment of ATSPCP tool 46 communicating with a user 34 over the Internet. In the preferred embodiment, ATSPCP tool 46 is a set of processor-executable instructions stored on a processor-readable medium. The processor-readable medium may be, for example, a computer hard disc, a Digital Video Disc (DVD), a Compact Disc (CD), a floppy disc, a solid-state memory device such as Random Access Memory (RAM), FLASH, Electrically Erasable Read Only Memory (EPROM), or a removable memory drive. The instructions stored on the processor-readable medium are read by a computer and executed by the computer. In other embodiments, ATSPCP 46 is executed on a computer and may communicate with a user directly via a display or remotely via a network such as a Local Area Network (LAN).

In the preferred embodiment illustrated in FIG. 6, a first computer 30 is connected to a first network port 35 which accesses the Internet 31 to reach a second network port 32 connected to a second computer 33 operated by user 34. The ATSPCP tool 46, executed on computer 33, communicates a power management characteristic query 36 to user 34 via the Internet 31. A user response 37 to the query is communicated back to the selection tool based on the user response 37, the ATSPCP tool 46 selects a power management integrated circuit tile 38. In the preferred embodiment, query 36 includes a webpage or series of webpages rendered by a web browser operating on computer 33 such as Microsoft Internet Explorer and displayed to the user via the computer display. In other embodiments, the query 36 may be generated by software running on a computer, which displays the query directly to the user via the computer display.

FIG. 7A illustrates an example of power management characteristic query 36 displayed to user 34 as a webpage 40, soliciting input source information. In this example, input source information includes a user selection 41 of a battery as a primary source type and a user entry 42 of a maximum current of one ampere for a wall adaptor to be used as a secondary source type. A user selection is a selection of options specified in the query. For example, user selection 41 is a check mark in a dialog box and is included as part of user response 37 to query 36. A user entry is an indication of magnitude of parameters specified in the query. For example, user entry 42 is a numerical quantity indicating the maximum current required of the wall adaptor and is part of the user response 37 to the query 36. Examples of input source information 43 include input voltage information such as the supply voltage entry of webpage 40 and input current information such as the maximum current entry of webpage 40. Other examples of input source information may include limits on voltage or current rates. This example is not exhaustive; many other parameters may be solicited from a user as part of the solicitation for input source information.

FIG. 7B illustrates an example of power management characteristic query 36 displayed to user 34 as a webpage 44, soliciting power output requirement information. Examples of power output requirement information 45 include the number of power supply output channels and output voltage information and output current information associated with each channel. FIG. 7B illustrates a minimum current requirement associated with each channel as an example of output current information and an output voltage requirement as output voltage information 45. This example is not exhaustive; many other parameters may be solicited from a user as part of the solicitation for power output requirement information.

Figure 7C:
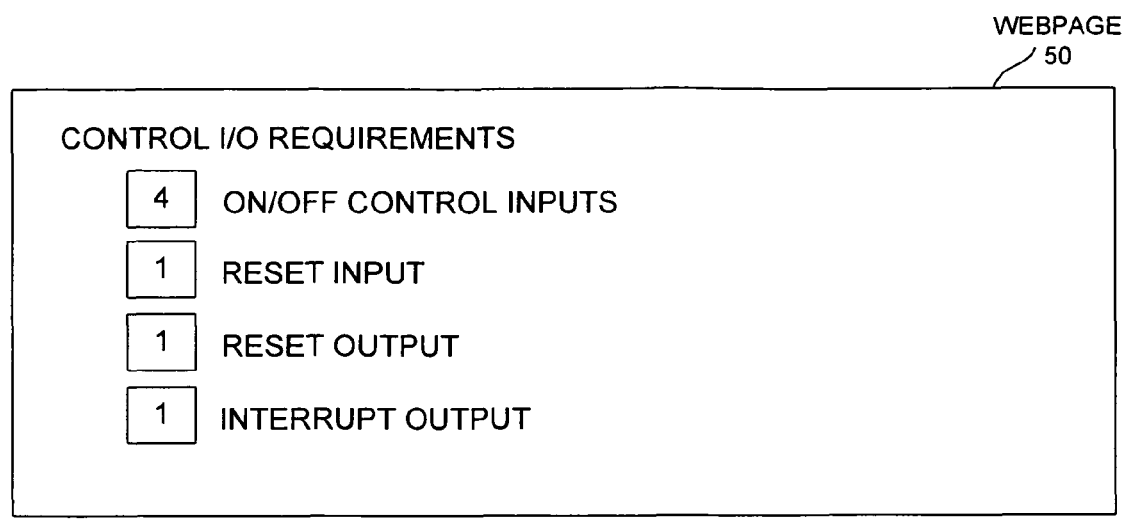

FIG. 7C illustrates an example of power management characteristic query 36 displayed to user 34 as a webpage 50, soliciting control I/O requirements. Examples of control I/O requirements illustrated in FIG. 7C include a quantity of ON/OFF control inputs, a quantity of reset inputs, a quantity of reset outputs, and a quantity of interrupt outputs. This example is not exhaustive; many other parameters may be solicited from a user as part of the solicitation for control I/O requirements. In some embodiments, there is no solicitation for control I/O requirements.

FIG. 8 is a diagram illustrative of integrated circuit tile options displayed to user 34 as a webpage 60. In the preferred embodiment, a list of integrated circuit tile options is generated by the ATSPCP tool 46 based on the user response 37 to the power management characteristic query 36. Webpage 60 is a solicitation for a user response indicating the quantity and type of integrated circuit tiles preferred by user 34 to meet the requirements informed by the information solicited in the power management characteristic query 36. Based on the user response to webpage 60, the ATSPCP tool 46 selects a plurality of power management integrated circuit tiles. In another embodiment, the ATSPCP tool 46 selects a power management integrated circuit tile directly in response to the user response 37 to the power management characteristic query. In some embodiments, a graphical representation (for example, a rectangular representation of the boundaries) of the power management integrated circuit tile is selected. In other embodiments, a textual representation of the power management integrated circuit tile is selected.

Figure 9:
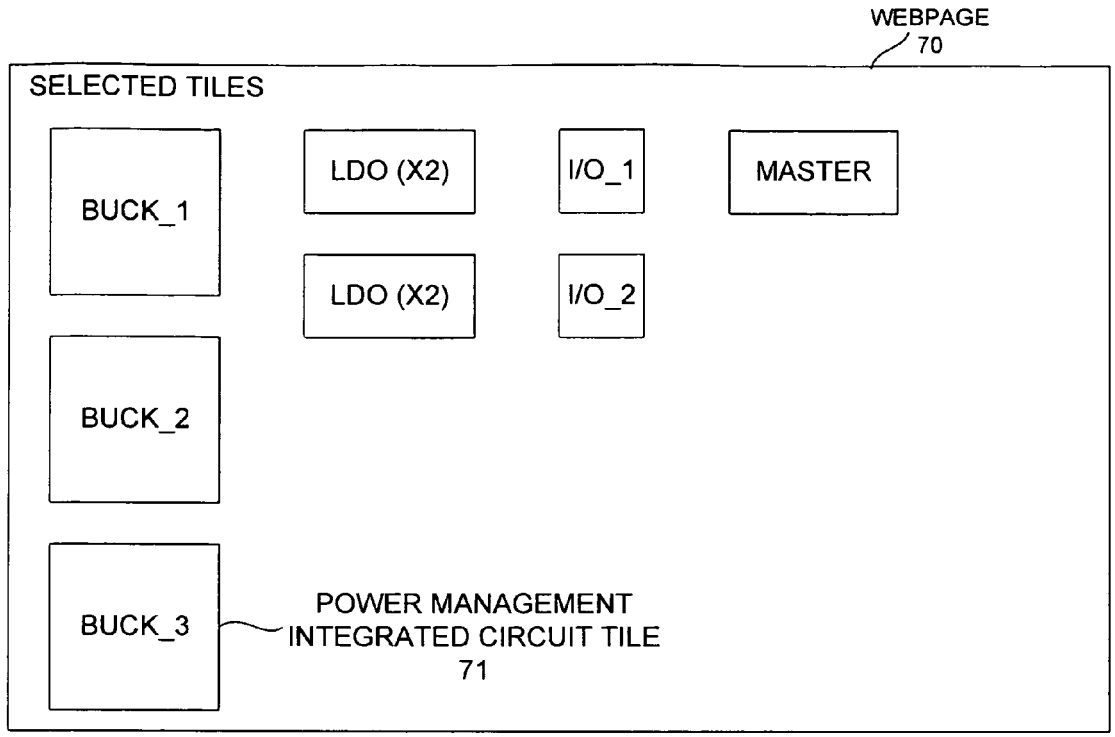
FIG. 9 is a diagram illustrative of a graphical representation of selected tiles in accordance with the novel aspect of FIG. 6.

FIG. 9 is a diagram illustrative of graphical representations of selected tiles, displayed to user 34 as a webpage 70. In the preferred embodiment, the displayed tiles are presented to the user in a simple graphical or icon form and do not contain detailed information of the physical features of the circuitry. For example, power management integrated circuit tile 71 is presented as a simple square shape representative of the actual physical shape of the tile and a textual identifier of the tile. There are no details presented concerning the internal functional circuitry of tile 71.

Figure 10:
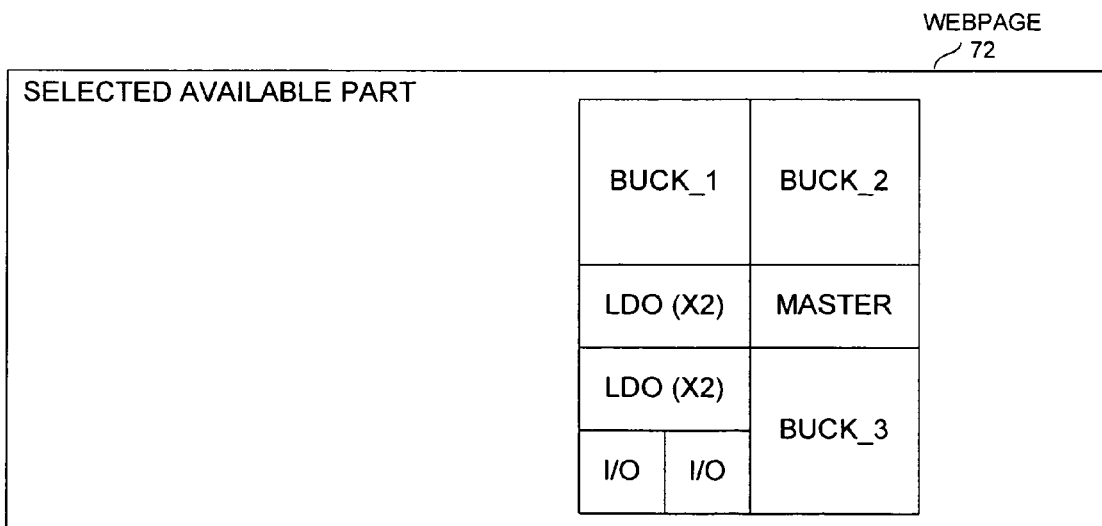
FIG. 10 is a diagram illustrative of a multi-tile integrated circuit in accordance with the novel aspect of FIG. 6. The multi-tile integrated circuit is comprised of abutting graphical representations of the selected tiles.

FIG. 10 is a diagram illustrative of another example of a graphical representation of selected tiles displayed to user 34 as a webpage 72. In this example, the ATSPCP tool 46 communicates a simple graphical representation or icon of the selected integrated circuit tiles in a proposed integrated circuit. Because of the novel standardized bus structure discussed above, physical layout data suitable for integrated circuit fabrication can be directly generated by ATSPCP 46 for the integrated circuit displayed in webpage 72. ATSPCP tool 46 can generate the physical layout data based on the known physical layout data of each individual tile. ATSPCP tool 46 may automatically place the tiles as displayed in webpage 72.

In another embodiment ATSPCP tool 46 generates a list of available MTPMICs in response to the requirements informed by the user response 37 of the power management characteristic query 36. The available parts may meet the requirements or substantially meet the requirements as discussed above.

Figures 11A, 11B:
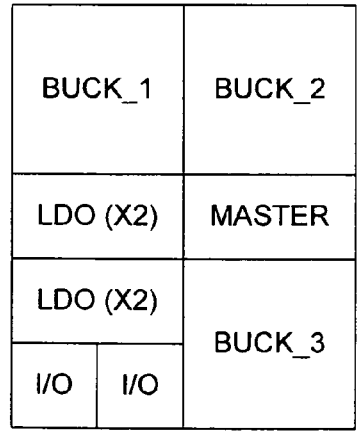
FIG. 11A-11B are diagrams illustrative of graphical representations of available parts and a selected available part, respectively, that meet the requirements solicited in FIG. 6.

FIG. 11A is a diagram illustrative of a textual representation of available MTPMIC parts communicated to a user 34 as a webpage 80. Available parts are presented to the user to solicit user preference for the quantity and type of available integrated circuit parts preferred by a user 34 to meet the requirements informed by the information solicited in the power management characteristic query 36. In response to the solicitation of webpage 80, the selection tool selects an available integrated circuit part.

FIG. 11B is a diagram illustrative of a graphical representation of a selected available part communicated to a user 34 as a webpage 81. The simple graphical or icon form includes an indication of the relative dimensions of PMIC tiles and an identifier for each tile, but does not contain detailed information of the physical features of the circuitry.

In the case where the selected available integrated circuit part does not meet the requirements informed by the information solicited in the power management characteristic query 36, additional discrete components may be selected by ATSPCP tool 46 to meet the requirements. This selection may be made directly by the selection tool or informed by a solicitation of user preference for discrete components. The discrete components are additional elements that are external to the integrated circuit.

Figure 12:
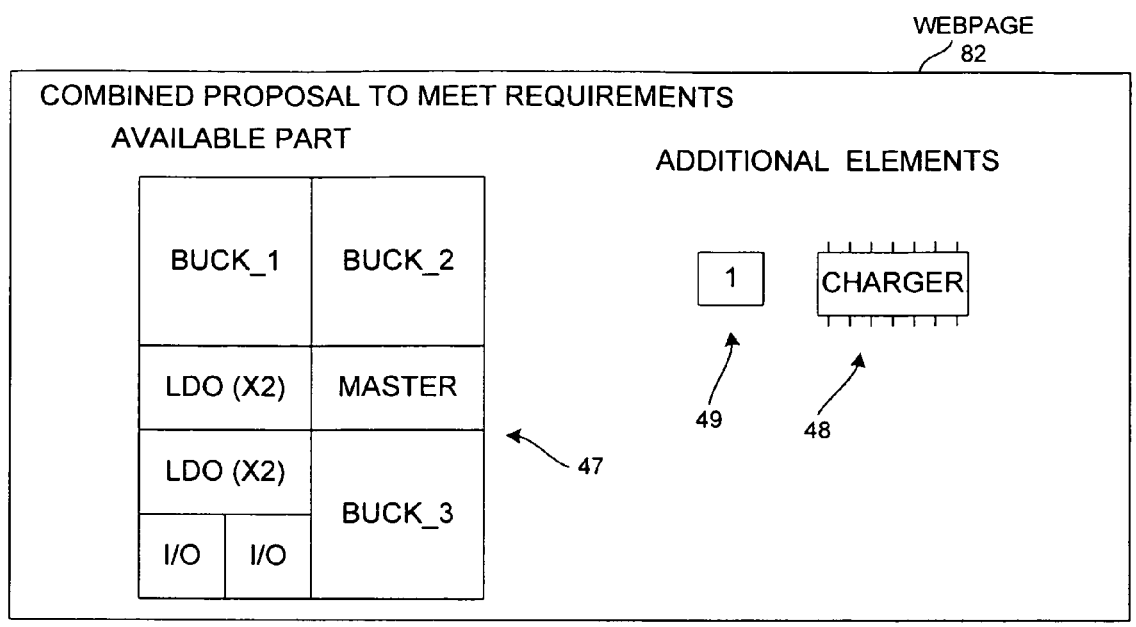
FIG. 12 is a diagram illustrative of a combined proposal to meet the requirements of FIG. 6. The combined proposal includes both a multi-tile integrated circuit (involving PMIC tiles) and an external, discrete component.

FIG. 12 illustrates a webpage 82 communicated to a user 34 that includes a graphical representation of a "combined proposal" to meet the requirements. The combined proposal includes an available integrated circuit 47 and at least one discrete component 48. Available integrated circuit 47 and discrete components 48 and 49 can satisfy the user requirement if the integrated circuit 47 and components 48 and 49 are interconnected appropriately on a printed circuit board.

FIG. 13 illustrates novel ATSPCP tool 46 communicating with a user over the Internet. In the preferred embodiment, tool 46 is a set of processor-executable instructions stored on a processor-readable medium. The processor-readable medium may be, for example, a computer hard disc, a DVD, a CD, a floppy disc, a solid-state memory device such as RAM, FLASH, EPROM, or a removable memory drive. The instructions stored on the processor-readable medium are read by a computer and executed by the computer. In other embodiments, the placement tool operating on a computer may communicate with a user directly via a display or remotely via a network such as a Local Area Network (LAN).

Figure 13A:
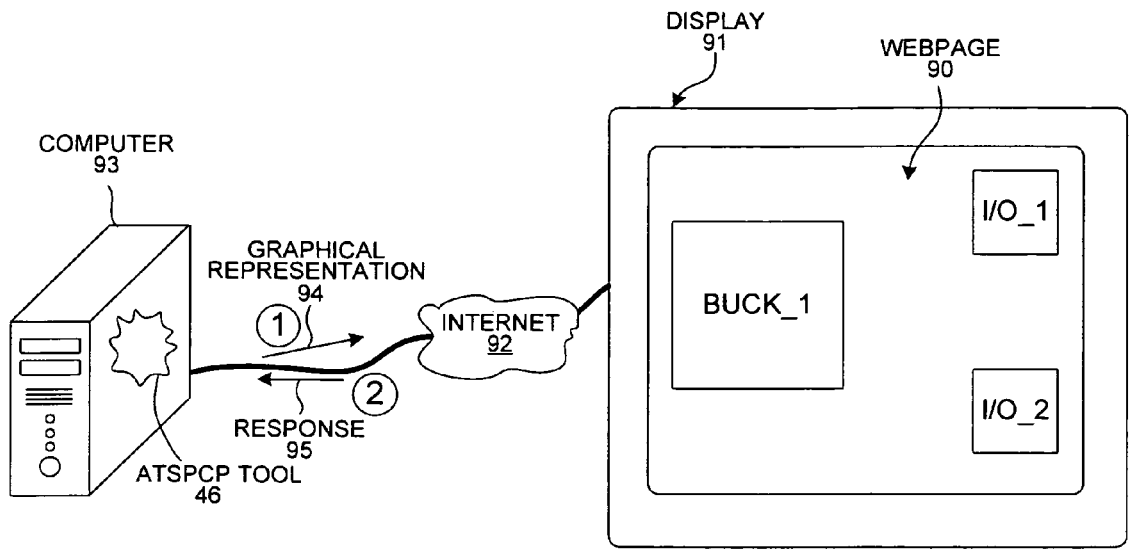
FIGS. 13A-13B are diagrams illustrative of a method of placing and manipulating PMIC tiles in accordance with a second novel aspect.
Figure 13B:
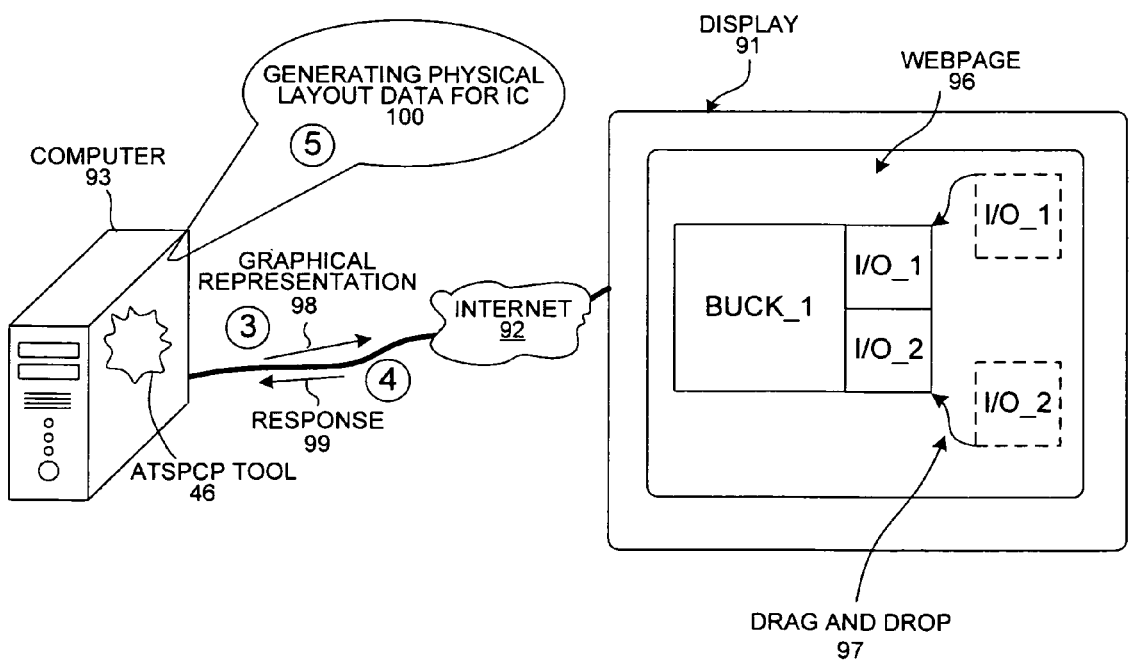

In the preferred embodiment illustrated in FIGS. 13A and 13B, a computer 93 is connected to the Internet 92 and a display 91 renders a webpage 90 including content communicated from the computer 93. FIG. 13A illustrates, in a first step, the tool 46 executed on computer 93, communicating a first graphical representation 94 across the Internet 92. Display 91 renders the graphical representation 94 in a webpage 90. The webpage 90 illustrates individual integrated circuit tiles that have not been placed together to form a proposed integrated circuit. In a second step, a response 95 to the graphical representation 94 is received by the tool 46 indicating a user preference to place the tiles together to form a proposed integrated circuit.

FIG. 13B illustrates; in a third step, the tool 46 communicating a second graphical representation 98 across the Internet 92. Display 91 renders the graphical representation in a webpage 96. The webpage 96 illustrates individual integrated circuit tiles placed together to form part of a proposed integrated circuit. The user may perform a drag and drop operation 97 to move representations of the tiles of FIG. 13A so that they form a proposed integrated circuit as illustrated in FIG. 13B. In a fourth step, a response 99 is received by computer 93 indicating user satisfaction with the proposed integrated circuit tile placement. In response, in a fifth step, the tool 46 generates physical layout data for fabrication for the proposed integrated circuit.

Figure 14:
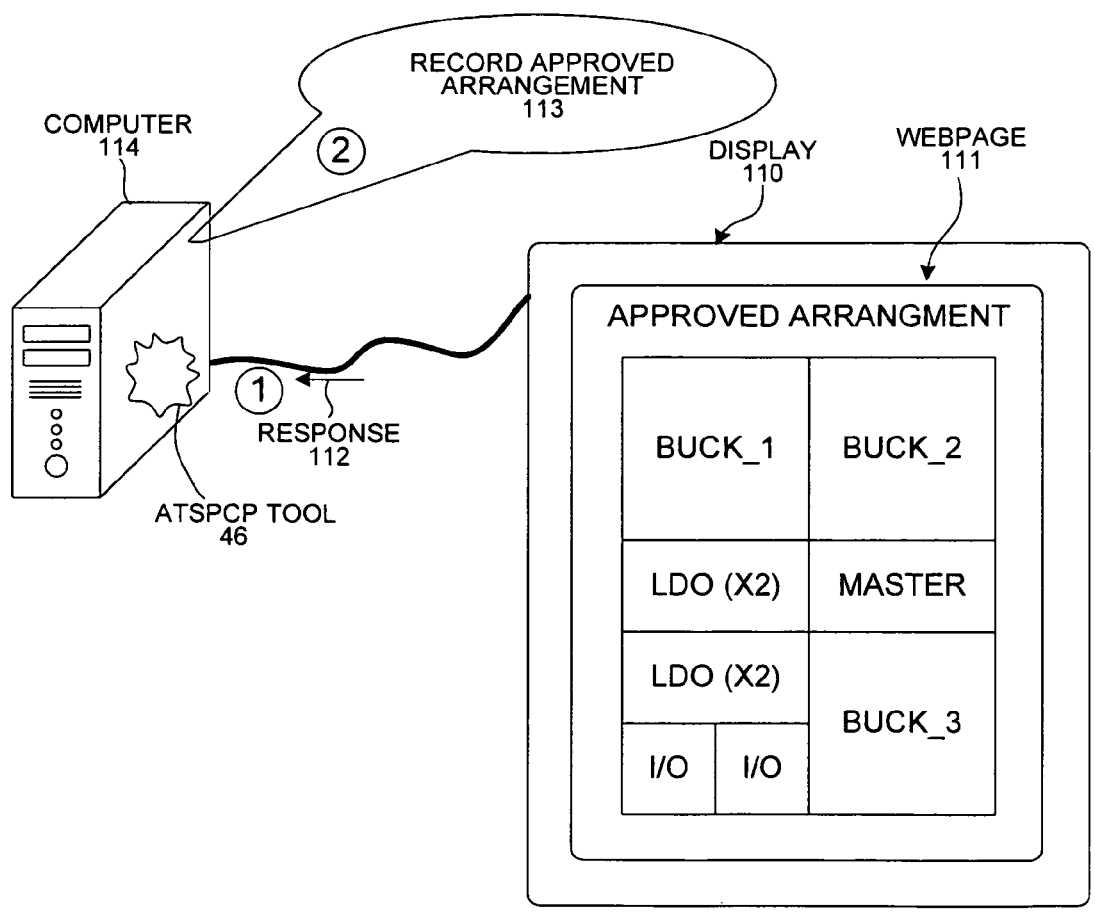
FIG. 14 is a diagram illustrative of a method of recording an arrangement of PMIC tiles.

FIG. 14 is a diagram illustrative of another embodiment of the operation of ATSPCP tool 46 including a recording step. In a first step, a computer 114 executing the ATSPCP tool 46 receives a response 112. Response 112 indicates user satisfaction with an approved arrangement of a proposed integrated circuit graphically represented in a webpage 111 by display 110. In response to response 112, the ATSPCP tool 46 records the approved arrangement 113 on a memory device accessible by computer 114 as a recorded arrangement.

Figure 15:
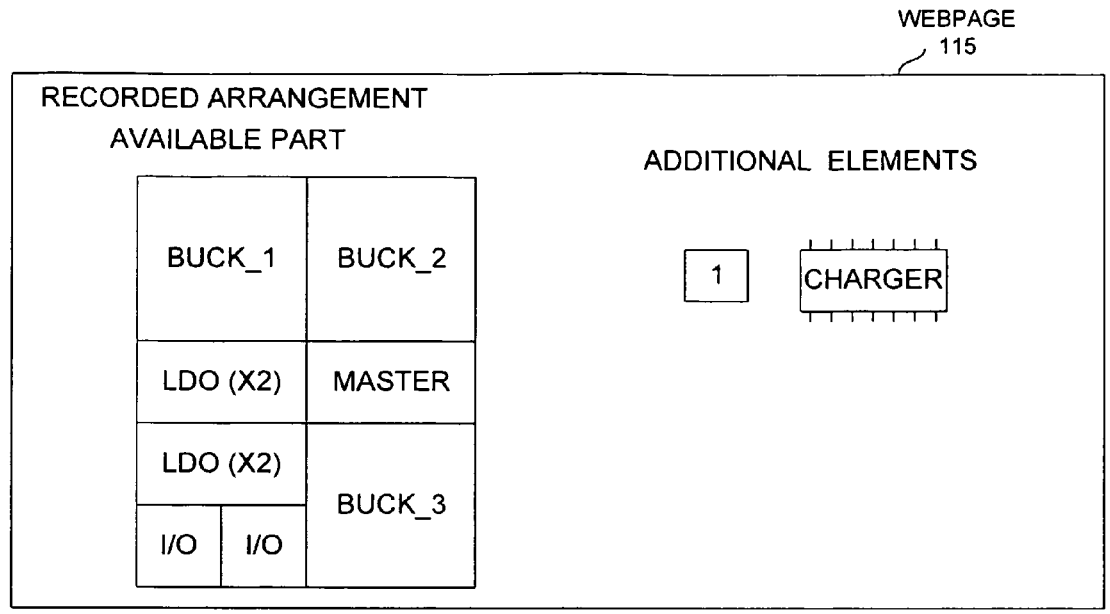
FIG. 15 is a diagram illustrative of a webpage communicating a recorded arrangement. The recorded arrangement includes a multi-tile integrated circuit and an external, discrete component.

FIG. 15 illustrates another step of displaying via webpage 115 a graphical representation of a recorded arrangement that includes an integrated circuit and at least one discrete component.

Figure 16:
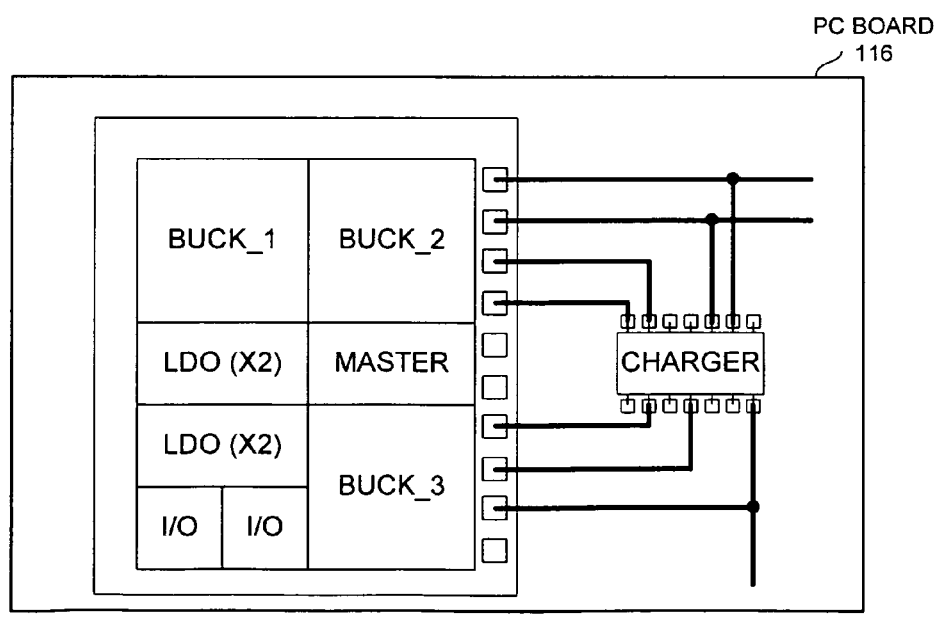
FIG. 16 is a diagram illustrative of a printed circuit board implementation of a circuit that satisfies the user requirements. The implementation is based on the recorded arrangement of FIG. 15.

FIG. 16 illustrates a design of a portion of a printed circuit board based on the recorded arrangement illustrated in FIG. 15.

Figure 17:
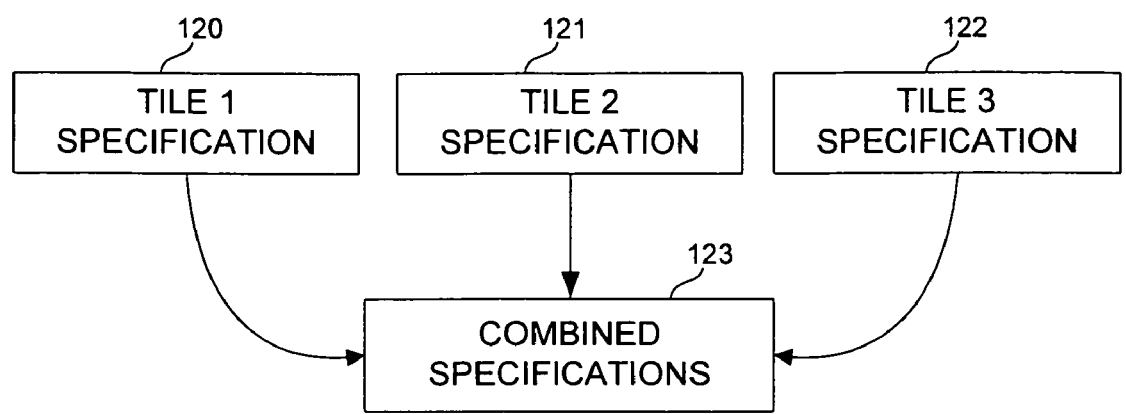
FIG. 17 is a diagram illustrative of combining the specifications of individual tiles into a combined specification for a MTPMIC that includes the individual tiles.

FIG. 17 illustrates combining the specifications of three individual tiles 120-122 into a combined specification 123 for an integrated circuit comprising the three tiles. Combined specifications may include package data, for example, pinout data, dimension data, pitch of leads, application data, and performance specifications for the integrated circuit.

Figure 18:
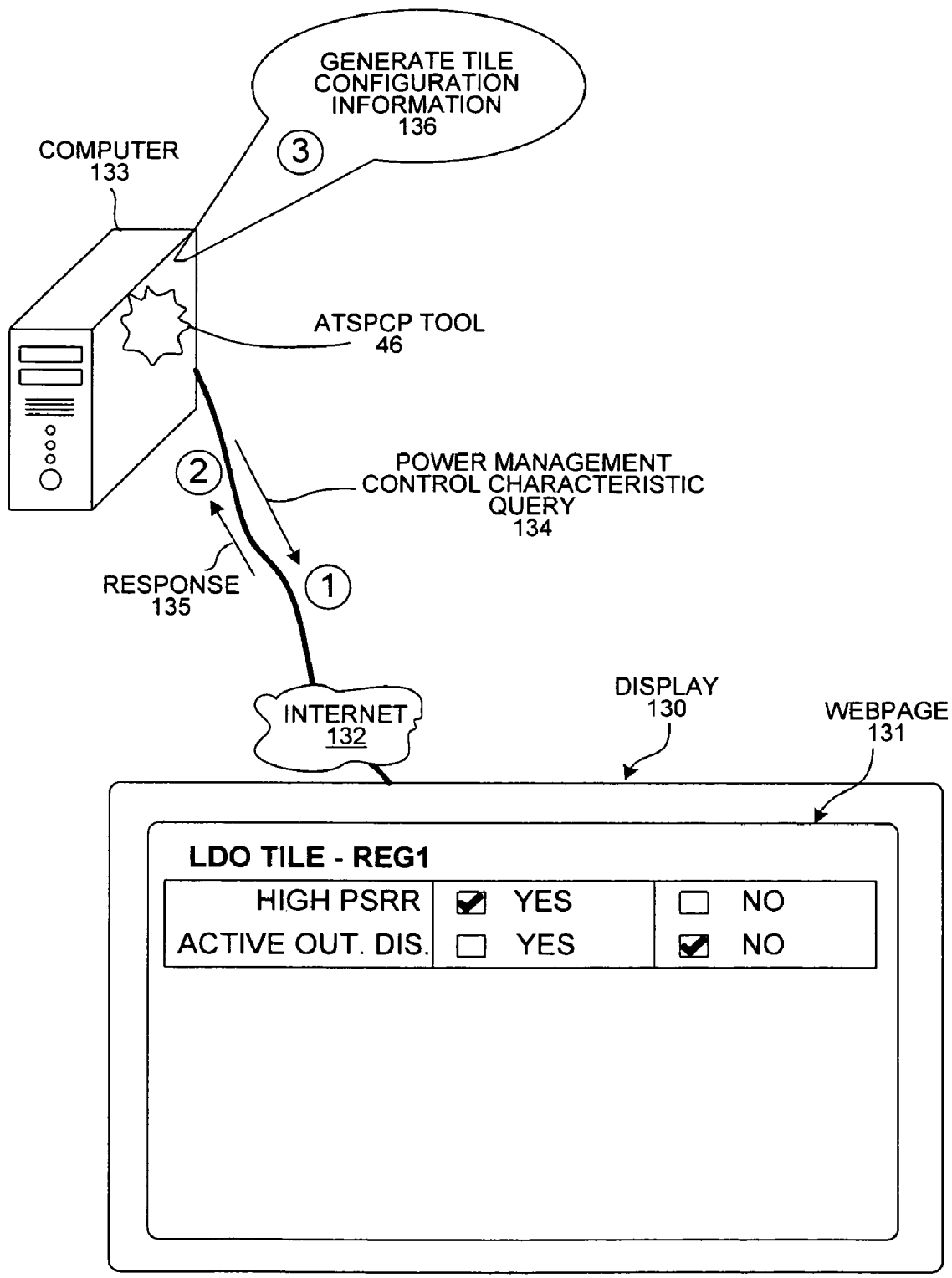
FIG. 18 is a diagram illustrative of a method of generating tile configuration information in accordance with a third novel aspect.

FIG. 18 is illustrative of the operation of ATSPCP tool 46 in accordance with another novel aspect. In the preferred embodiment, ATSPCP tool 46 is a set of processor-executable instructions stored on a processor-readable medium. The processor-readable medium may be, for example, a computer hard disc, a DVD, a CD, a floppy disc, a solid-state memory device such as RAM, FLASH, EPROM, or a removable memory drive. The instructions stored on the processor-readable medium are read by a computer and executed by the computer. In other embodiments, ATSPCP tool 46 operating on a computer may communicate with a user directly via a display or remotely via a network such as a Local Area Network (LAN).

A computer 133 is connected to the Internet 132 and a display 130 renders a webpage 131 including content communicated from the computer 133. In a first step, ATSPCP tool 46, executed by computer 133, communicates a power management control characteristic query 134 across the Internet 134. Display 130 renders the query in webpage 131. The webpage 131 includes a solicitation for control requirement information. In a second step, a response 135 to the query 134 is received by the tool 46 indicating user preferences for control characteristics. In response, in a third step, the tool 46 generates tile configuration information 136.

FIG. 19A illustrates an example power management control characteristic query included in webpage 140 soliciting control requirement information. For example, questions are specifically directed toward the desired characteristics of each tile to elicit control requirements. For the master tile, these questions include a preference for interface protocol, clock frequency, reset timeout period, push button interface, reference bypass, a desired register controlling a first tile ON/OFF state and the polarity of that state. Additional questions are specifically directed toward the desired characteristics of a first buck tile. These questions include a preference for standby voltage, operational mode, switching frequency, switching phase, fault interrupt, whether tracking should be enabled or not, and whether the tile should automatically turn on with a signal from the master tile. The responses to questions associated with each individual tile forms a part of the individual tile specification for each tile that will operate in a multi-tile integrated circuit.

Due to the novel memory structure discussed earlier, in the preferred embodiment, the memory present in each individual tile stores the tile configuration information for that tile alone. An address to identify the memory and the function of each bit value stored in each configuration register is predetermined. Thus, the control requirement information solicited for each tile as illustrated in FIG. 19A can be directly mapped to specific tile configuration information for each individual tile. As illustrated in FIG. 19B, tile configuration information is a bit string representative of the bit values to be stored in each configuration register of each tile in a MTP-MIC. In the example of FIG. 19B, the bit string of configuration information to be loaded into the "BUCK_1 REGISTER" is "10010110". In this manner, tile configuration information directly useable to configure an integrated circuit tile when stored in its configuration register can be directly generated in response to a power management control characteristic query for any multi-tile integrated circuit in which the tile is a part. There is no need to reference a custom memory structure for each integrated circuit design to establish the appropriate bit string and register addresses.

Figure 20:
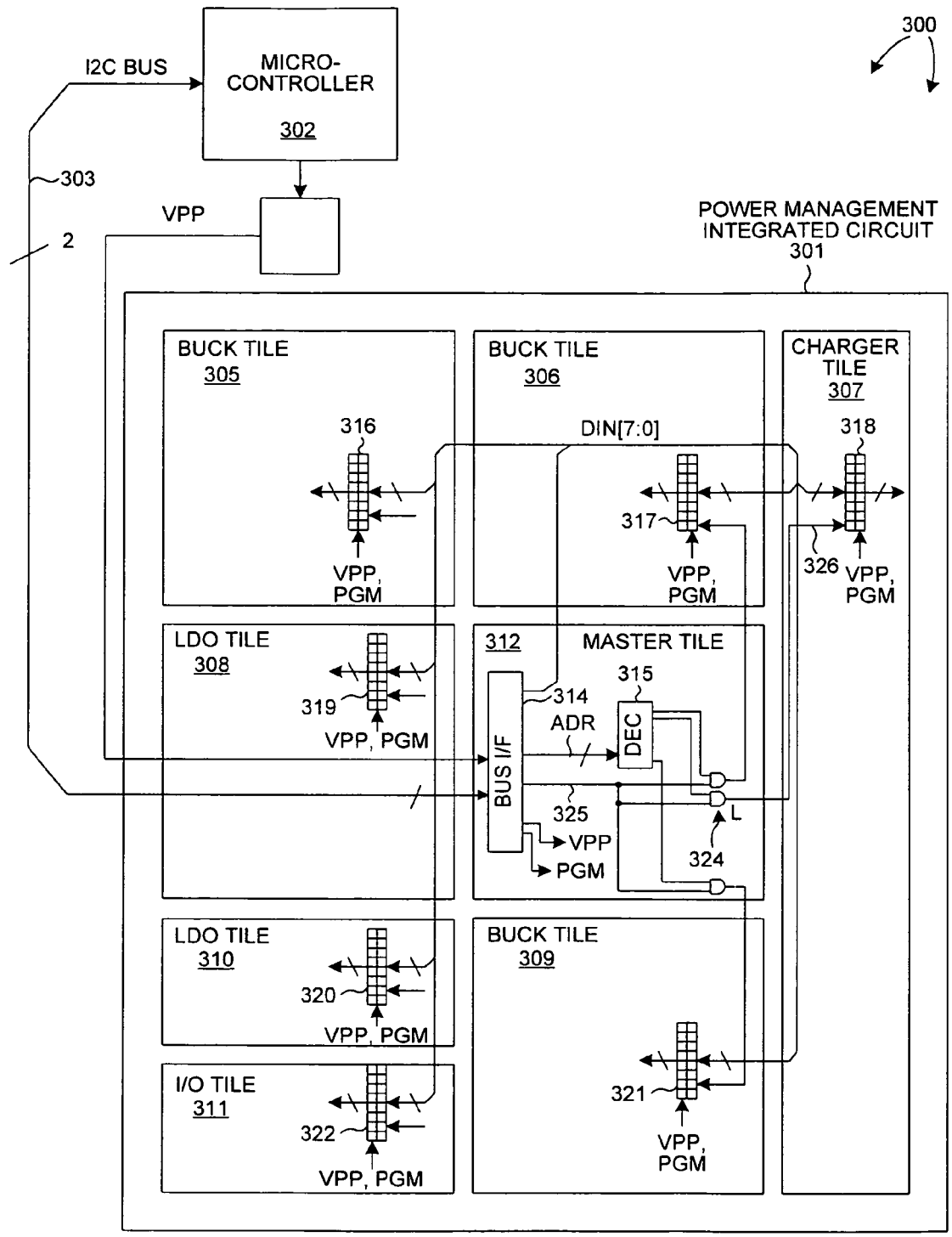
FIG. 20 is a diagram illustrative of a method of configuring a PMIC tile that is part of a MTPMIC.

FIG. 20 illustrates an example of configuring a tile with the tile configuration information 136 generated by ATSPCP tool 46. In the simplified illustration of FIG. 20, each tile is illustrated to include one eight-bit register of memory structures. These registers are designated with reference numerals 316-322. Bus interface block 314 in master tile 312 is coupled by a common data bus DIN[7:0] to the memory cells in each of the tiles. In the preferred embodiment the common data bus is part of the standardized bus 350 illustrated in FIG. 2. It is drawn separately in FIG. 20 for illustrative purposes.

In the present example, the tiles embody analog power control circuitry that is to be configured and controlled. An example of such circuitry is a constant current and constant voltage (CC-CV) battery charger circuit in tile 307. This charger circuit is to supply charge current to a battery that is external to integrated circuit 301. The voltage output by the charger circuit is a regulated voltage whose magnitude is determined by a first value stored into various ones of the memory structures of register 318. The current limit of the charger circuit is also programmable and is determined by a second value stored into various other ones of the memory structures of register 318. The charger circuit can also be disabled or enabled. Whether the charger circuit is enabled or disabled is determined by a third value stored into another one of the memory structures of register 318.

In one embodiment, each of the memory structures includes a non-volatile cell and a volatile cell. Upon power up of integrated circuit 301, the data content of the non-volatile cell is automatically transferred into the volatile cell. The data stored in the volatile cell in turn is supplied to the circuitry in tile 307 to configure and control the circuitry in tile 307. In one example, upon initial power up of integrated circuit 301, the non-volatile cells of the memory structures of register 318 power up into logic states such that the charger circuit in tile 307 is disabled. Thereafter, microcontroller 302 writes values into the memory structures of register 318 so as to configure the output voltage and the current limit of the charger circuit. Thereafter, microcontroller 302 writes the appropriate value into the appropriate memory structure of register 318 so as to enable the charger circuit. The charger circuit then functions to charge the external battery or external device as desired.

If system 300 were then to be powered down and powered up again, the microcontroller 302 would need not reconfigure the memory structures in tile 307 because the prior configuration information would have been stored in the non-volatile cells of register 318. The data content of the non-volatile cells would be automatically loaded into the corresponding volatile cells of register 318 so that the configuration information would then configure and control the circuitry of tile 307.

In the illustrated example, each of tiles 305-311 is coupled to receive the same data bus DIN[7:0], the same programming voltage conductor, and the same program signal conductor. The programming voltage conductor and the program signal conductor are designated by arrows labeled VPP and PGM. In addition to each of the tiles receiving these common conductors, each tile is coupled to receive its own local clock signal from master tile 312. The local clock signal supplied to tile 307 is identified by the reference numeral L. Local clock signal L is received by register 318 via clock signal conductor 326. The clock signal for only one of the registers is made to transition at a time. Which particular clock signal is allowed to transition depends on the value of an address ADR that is loaded through the bus interface block 314.

If, for example, microcontroller 302 is to write data into register 318 in tile 307, then microcontroller 302 supplies an address ADR via bus 303 to bus interface block 314. The address ADR is latched into bus interface block 314. Decoder 315 decodes the address. AND gates 324 allow a clock signal to be supplied on only one of the clock output lines. In this example where the address ADR identifies register 318 in tile 307, decoder 315 will allow a clock signal to pass from global clock conductor 325 to the local clock conductor 326 and to register 318.

Microcontroller 302 then writes the data to be written into register 318 into the bus interface block 314 via bus 303. This data is in turn supplied to all the registers of integrated circuit 301 via data bus DIN[7:0]. The bus interface block 314 then asserts the clock signal on global clock conductor 325, thereby supplying a local clock signal to the register that is addressed by address ADR. In the present example, the local clock signal L is supplied to register 318. This local clock signal L clocks the data from data bus DIN[7:0] into the volatile cells of register 318. In this way, microcontroller 302 can write data into the volatile cells of any desired one of the registers 316-322 of integrated circuit 301.

Once data has been written into the volatile cells of the desired register, a programming pulse signal is supplied to integrated circuit 301. This programming pulse signal is supplied to all the memory structures of all the registers 316-323 of integrated circuit 301. Each volatile cell in register 318 has a corresponding non-volatile cell. If the data content of the non-volatile cell differs from the data stored in the volatile cell, then the non-volatile cell is programmed to store the same data stored in the volatile cell. If the data content of the non-volatile cell does not differ from the data stored in the volatile cell, then the digital logic state stored in the non-volatile cell is not changed. In another embodiment, a programming pulse signal is generated on board integrated circuit 301. In this manner, field programming of integrated circuit 301 can be achieved. For example, changes to volatile memory during system operation can be made to transition to a sleep mode or a power down mode.

Figure 21:
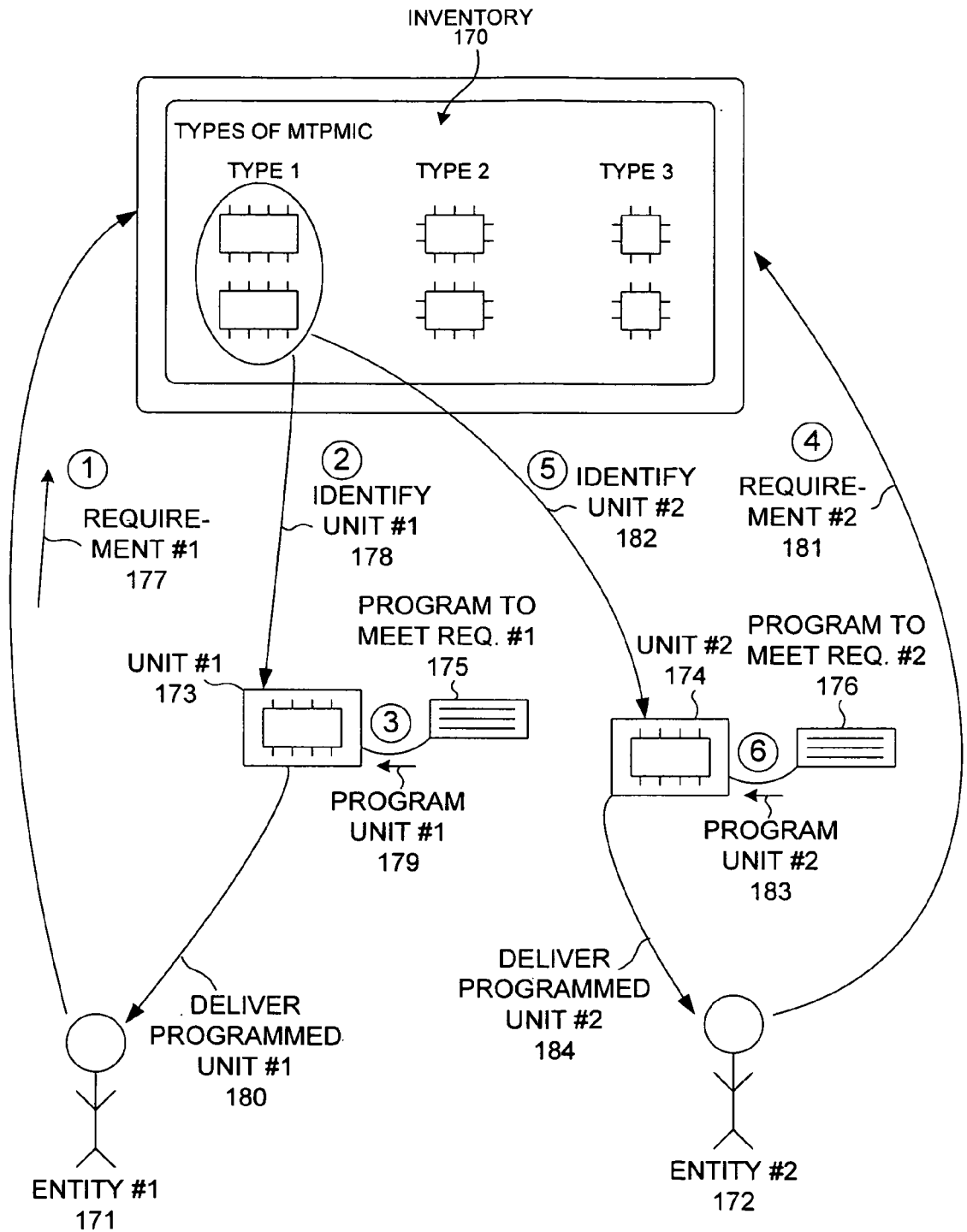
FIG. 21 is a diagram illustrative of a method of programming two units of a MTPMIC of the same type in two different ways in accordance with a fourth novel aspect.

FIG. 21 is an illustration of ATSPCP tool 46 in accordance with another novel aspect. In the preferred embodiment, ATSPCP tool 46 is a set of processor-executable instructions stored on a processor-readable medium. The processor-readable medium may be, for example, a computer hard disc, a DVD, a CD, a floppy disc, a solid-state memory device such as RAM, FLASH, EPROM, or a removable memory drive. The instructions stored on the processor-readable medium are read by a computer and executed by the computer. In other embodiments, ATSPCP tool 46 operating on a computer may communicate with a user directly via a display or remotely via a network such as a Local Area Network (LAN).

In a first step the ATSPCP tool 46 receives a first requirement 177 from a first entity 171. In a second step, tool 46 identifies a first unit of a particular type of multi-tile power management integrated circuit (MTPMIC). In a third step, the identified first unit is programmed in accordance with a program designed to meet the first requirement. The program is the tile configuration information necessary to configure each tile of the MTPMIC. The programmed first unit is delivered to the first entity. In a fourth step, ATSPCP tool 46 receives a second requirement from a second entity. In a fifth step, ATSPCP tool 46 identifies a second unit of the same type of MTPMIC as the first unit. In a sixth step, the identified second unit is programmed in accordance with a program designed to meet the second requirement. The program is the tile configuration information necessary to configure each tile of the MTPMIC to meet the second requirement. The programmed second unit is delivered to the second entity. Units of the same type are the same or substantially similar.

An aspect of the preferred embodiment is ease with which the same type of MTPMIC can be reconfigured to meet different customer requirements. The power management integrated circuit 301 introduced in FIG. 2 is reproduced in simplified form in FIG. 22. For example, each buck converter tile can deliver one channel of output voltage of five volts at a maximum current of one ampere. If the first requirement of the first entity requires three channels of output voltage at 3.3 volts at a maximum current of one ampere, each of the three buck tiles can be configured to deliver one channel of required voltage by configuring the output voltage of each buck tile to 3.3 volts with the appropriate tile configuration information in a manner analogous to the discussion of FIG. 20. A second requirement from a second entity requires one channel of output voltage at 3.3 volts with a maximum current of two amperes. In one embodiment, this requirement can be satisfied by programming another unit of the same type by disabling one buck tile and connecting the remaining two buck tiles in a two-phase buck converter arrangement to provide increased power supply output capability. In this arrangement, a first buck tile is programmed with an output phase of zero degrees and a second buck tile is programmed with an output phase of one hundred eighty degrees. Furthermore, a common pulse width modulation control signal is shared by both buck converters to achieve increased power output supply capability. For example, in a master/slave arrangement, the pulse width modulation control signal generated by the first buck tile is not only used for control of the first buck tile, but is also communicated to the second buck tile for control of the second buck tile.

Figure 22:
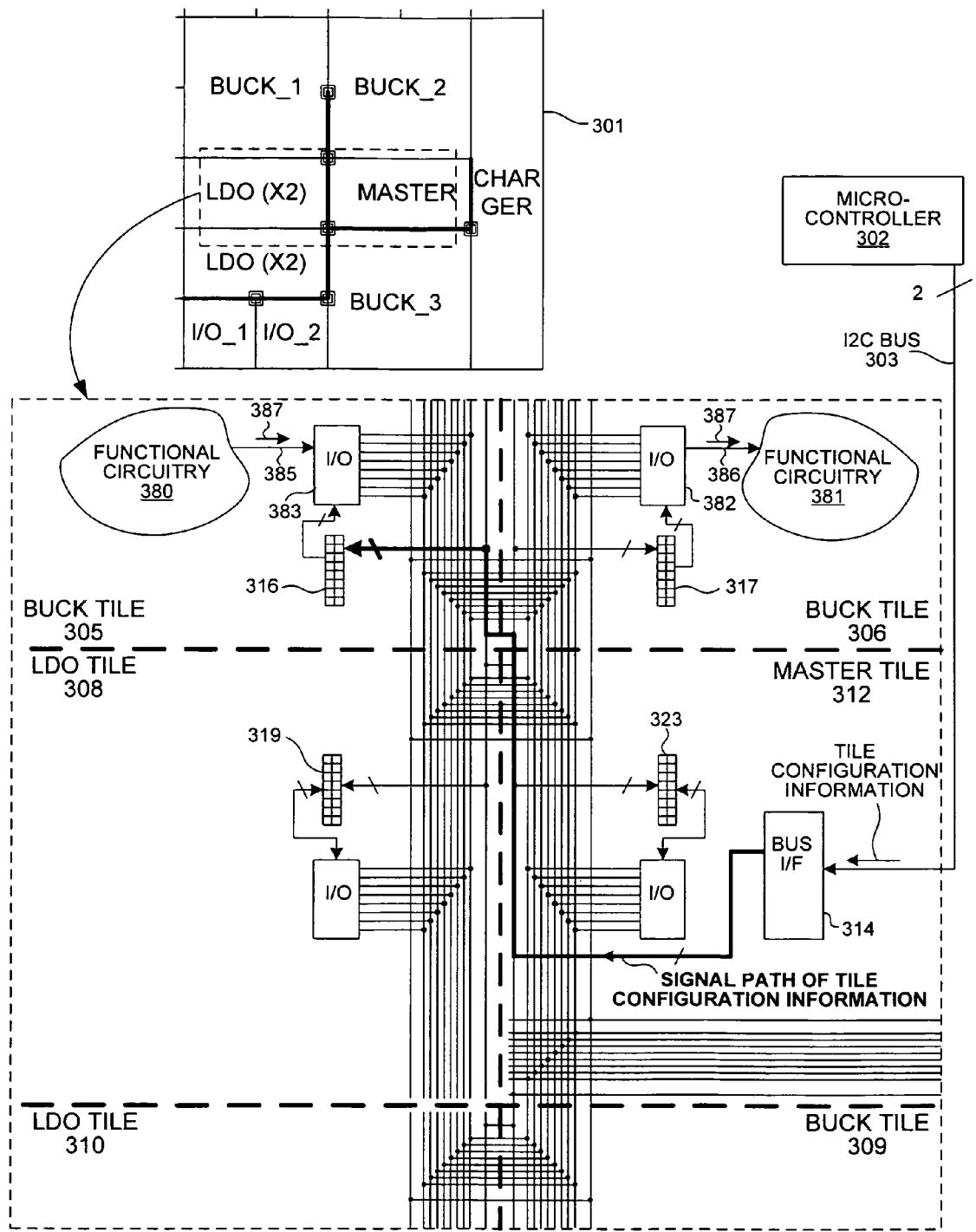
FIG. 22 is a diagram illustrative of the details of configuring two tiles to share a common bus conductor and the signal path of tile configuration information passing from a first tile, through a second tile, to a third tile in accordance with a fifth novel aspect.

A portion of power management integrated circuit 301 illustrated in FIG. 22 is depicted to illustrate the details of configuring the connection of two buck tiles to meet the second requirement in the manner discussed above. Each tile includes a bus portion, an input/output interface portion, a memory portion, and a functional portion. Buck tile 305 includes functional circuitry 380 that generates a pulse width modulation control signal 387 that is communicated to an input/output interface 383 on signal line 385. Similarly, buck tile 306 includes functional circuitry 381 that receives the pulse width modulation control signal 387 that is communicated from an input/output interface 382 on signal line 386. To meet the second requirement the pulse width modulation signal 387 must be communicated over a bus conductor from input/output interface 383 to input/output interface 382.

The interface portion of a tile includes a set of multiplexers and demultiplexers. The multiplexers and demultiplexers can be controlled to couple a desired one of the bus conductors to a desired one of a set of nodes. The functional circuitry is fashioned such that a signal conductor that is either to receive information from another tile or that is to output information to another tile is coupled to this node. By appropriate control of the multiplexers and demultiplexers in the interface portion, the signal conductor of the functional circuitry is coupled through the interface portion to a desired one of the bus conductors. Due to the way the conductors of the standardized bus are interconnected from tile to adjacent tile, the desired bus conductor extends to all the interface portions of all the tiles of the integrated circuit. The interface portion of one tile can therefore be configured to couple the conductor to a desired node of functional circuitry within another tile.

In the specific example of FIG. 22, each respective one of the signal lines 385 and 386 is connected to a corresponding node on interface portion 383 and 382 respectively. The memory portion of each tile stores configuration information in non-volatile memory cells. This configuration information is supplied to and from the tile's functional circuitry to control the functional circuitry, and to the interface portion of the tile to control how the multiplexers and demultiplexers within the interface portion are configured. Accordingly, by changing the contents of the configuration information stored in the memory portions, the configuration of the multiplexers and demultiplexers in the interface portions of integrated circuit 121 can be changed.

In the illustrated example of FIG. 22, the memory portion 316 of buck tile 305 and the memory portion 317 of buck tile 306 are loaded with tile configuration information such that signal line 385 of functional circuitry 380 of buck tile 305 is coupled through interface portion 383 and interface portion 382 to signal line 386 of functional circuitry portion 381 of buck tile 306.

The memory portions of the various tiles are loaded with configuration information through master tile 312 in a manner analogous to the description of FIG. 20. The signal path of the tile configuration information from the bus interface 314 of master tile 312 to memory portion 316 of buck tile 305 is illustrated in FIG. 22. In another novel aspect, a programmable analog tile integrated circuit is configured over a standardized bus by communicating tile configuration information from a first integrated circuit tile, through a second integrated circuit tile, to a third integrated circuit tile. Each of the three integrated circuit tiles are part of an integrated circuit. In the example of FIG. 22, the conductors that form the standardized bus route the tile configuration information from the master tile 312 through the buck tile 306 to the buck tile 305. In another embodiment, master tile 312 provides a reference voltage, a clock signal, and other shared resources to all tiles via the standardized bus.

Similarly, power supply tiles can be configured for parallel or multi-phase operation. Tile outputs can be cascaded or connected in series, where one tile output becomes the input supply to another module. Depending on the particular requirements, those skilled in the art will readily recognize a multiplicity of alternative and suitable dynamically configurable architectures that can be realized by simply programming each tile to operate in a selectable number of ways and to connect tiles together in a flexible manner. All of this can be achieved without having to rework the layout of the IC or perform design validation, circuit simulations, or physical design verification because the standardized bus makes all signal lines available to each tile and tile configuration information can be generated for each tile that connects each tile to the standardized bus in the appropriate manner. For additional detail on configuring tiles to communicate with one another, see: U.S. Pat. No. 7,788,608, filed Oct. 29, 2007 (the entire subject matter of which is incorporated herein by reference).

Figure 23:
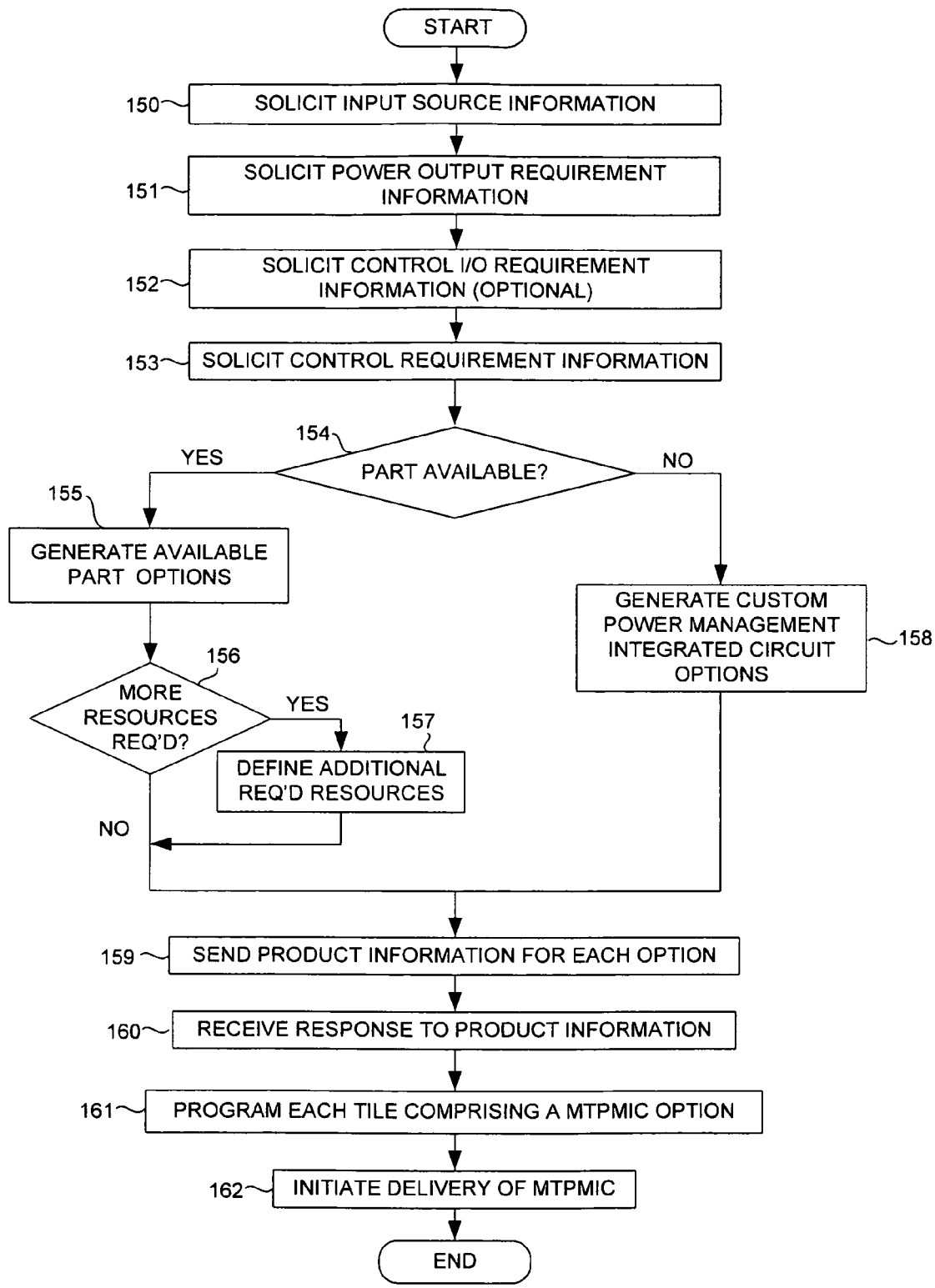
FIG. 23 is a simplified flowchart of a method of soliciting user requirements and of programming a MTPMIC to meet the user requirements.

FIG. 23 is a flowchart illustrative of one example of steps to program power management integrated circuit tiles to meet customer requirements. The process begins by soliciting input source information 150, power output requirement information 151, control I/O requirement information, and control requirement information 153. Solicitation of control I/O requirement information is optional. In some embodiments, information 150-153 is solicited as part of a power management characteristic query and a power management control characteristic query. The information solicited is used to evaluate 154 whether an available part meets or substantially meets the requirements informed by the information solicited in 150-153. If at least one part is available, available part options are generated 155. Each of these options is evaluated 156 to determine if the option meets the requirements informed by the information solicited in 150-153, or if additional resources are required. If additional resources are required, these additional resources are defined 157 such that the available part option and the additional resources meets the requirements informed by the information solicited in 150-153. If it is determined that no part is available that meets or substantially meets the requirements informed by the information solicited in 150-153, then custom PMIC options are generated 158, which fulfill the requirements informed by the information solicited in 150-153. Product information relevant to PMIC options generated by 158 and/or 155-157 is sent to an entity, such as a prospective customer 159. Product information may include price information, lead time information, a solicitation for additional control requirement information, and ordering information. This list is not meant to be exhaustive. A response to the product information is received 160 and delivery of an MTPMIC is initiated based on the response 162.

Figure 24:
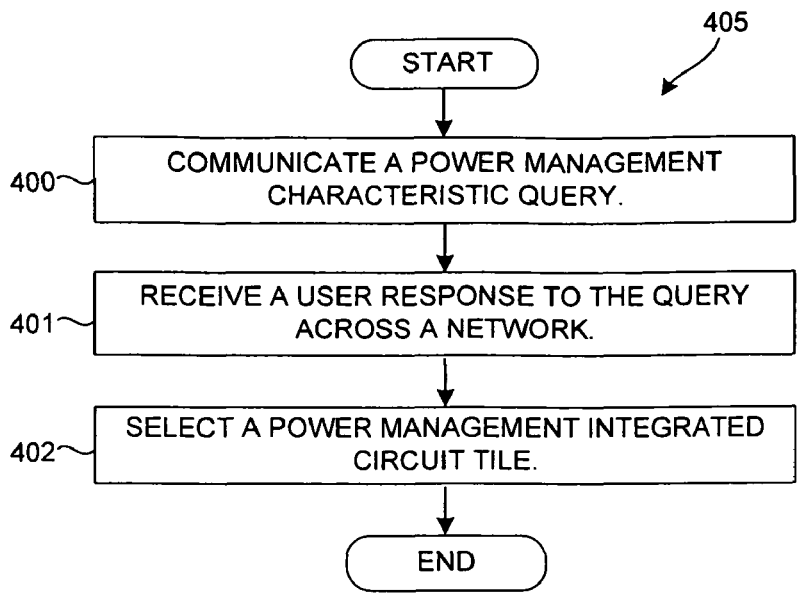
FIG. 24 is a simplified flowchart of a method of selecting a PMIC tile in accordance with the novel aspect of FIG. 6.

FIG. 24 is a flowchart of a method 405. A power management characteristic query is communicated (step 400) to a user, such as a prospective customer. A response to the query is received (step 401) across a network. The network may be, for example, a local area network (LAN) or the Internet. A PMIC tile is selected (step 402) in response. Steps 400-402 are performed by the ATSPCP tool 46.

Figure 25:
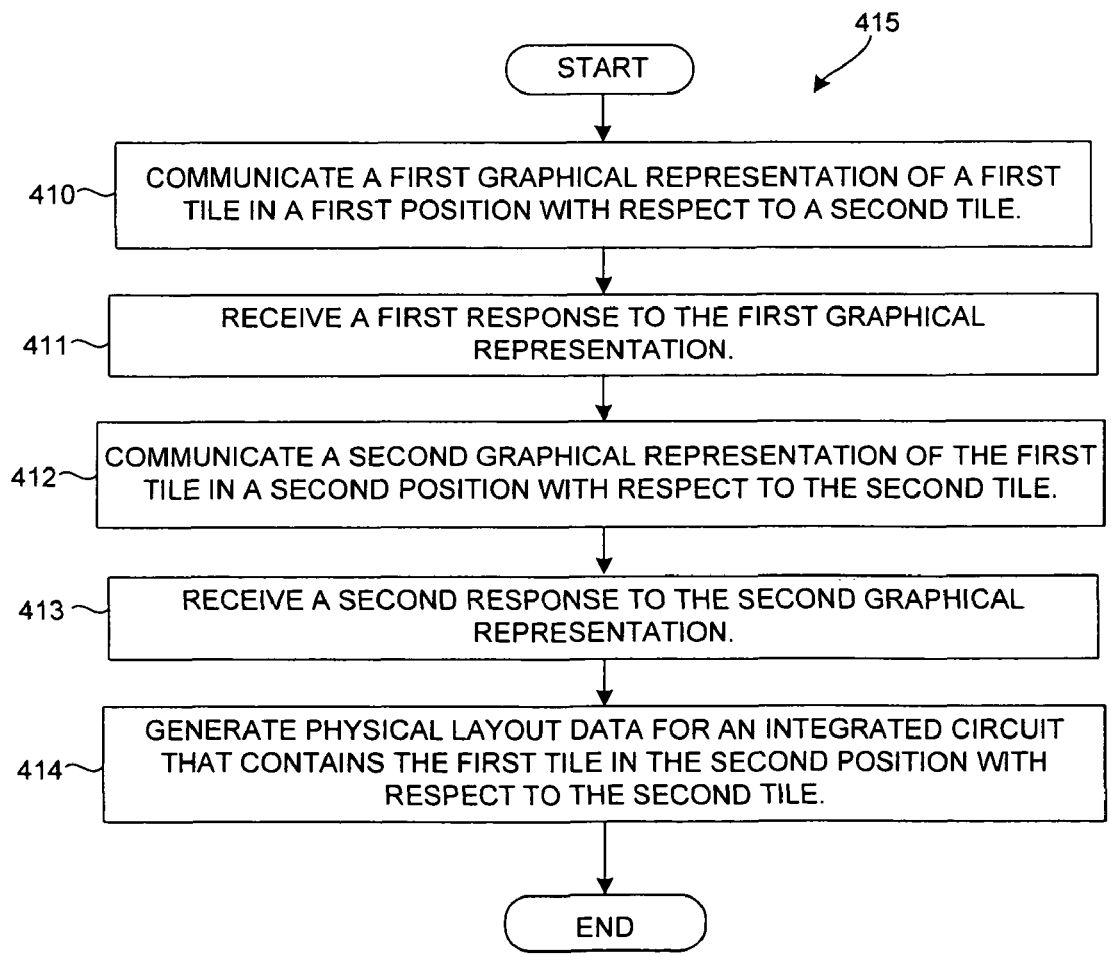
FIG. 25 is a simplified flowchart of a method of manipulating a graphical representation of a first PMIC tile with respect to a second PMIC tile and generating physical layout data for a MTPMIC including the first and second PMIC tiles in accordance with the novel aspect of FIG. 13.

FIG. 25 is a flowchart of a method 415. A first graphical representation of a first tile in a first position with respect to a second tile is communicated (step 410). A first response to the first graphical representation is received (step 411). In response to the first response, a second graphical representation of the first tile in a second position with respect to the second tile is communicated (step 412). A second response to the second graphical representation is received (step 413). The second response may, for example, be an approval of the second graphical representation. In response to the second response, physical layout data is generated (step 414) for an integrated circuit that contains the first tile in the second position with respect to the second tile. Steps 410-414 are performed by the ATSPCP tool 46.

Figure 26:
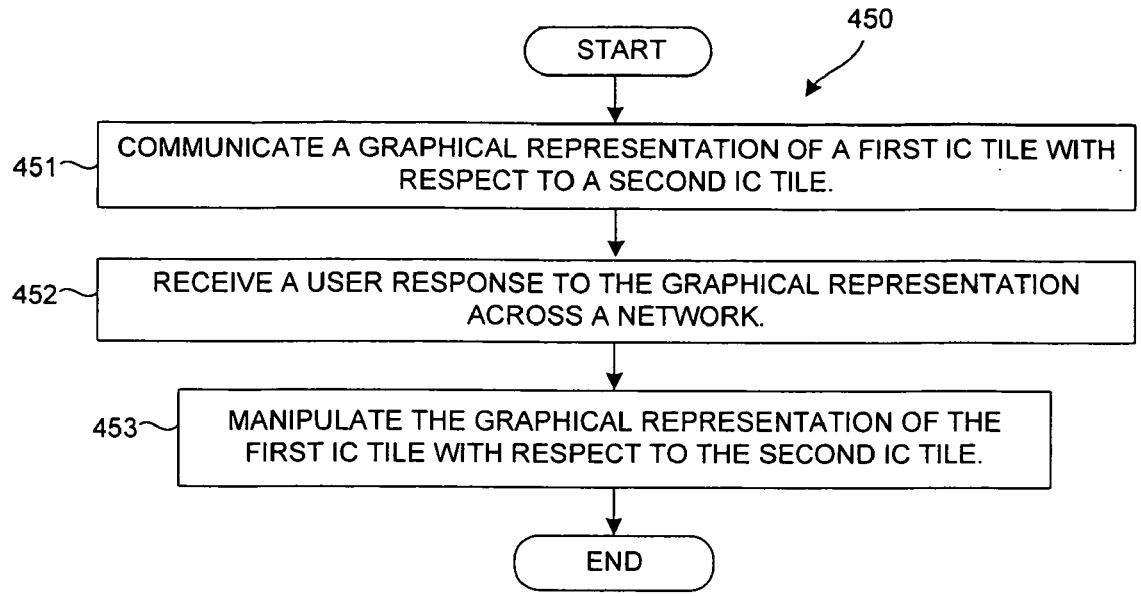
FIG. 26 is a simplified flowchart of a method of manipulating a graphical representation of a first tile with respect to a second tile in accordance with the novel aspect of FIG. 13.

FIG. 26 is a flowchart of a method 450. A graphical representation of a first integrated circuit tile in a first position with respect to a second integrated circuit tile is communicated (step 451). The graphical representation may, for example, be communicated across the Internet. A response to the graphical representation is received (step 452) across the network. In response, the graphical representation of the first tile positioned with respect to the second tile is manipulated (step 453). Steps 451-453 are performed by the ATSPCP tool 46.

Figure 27:
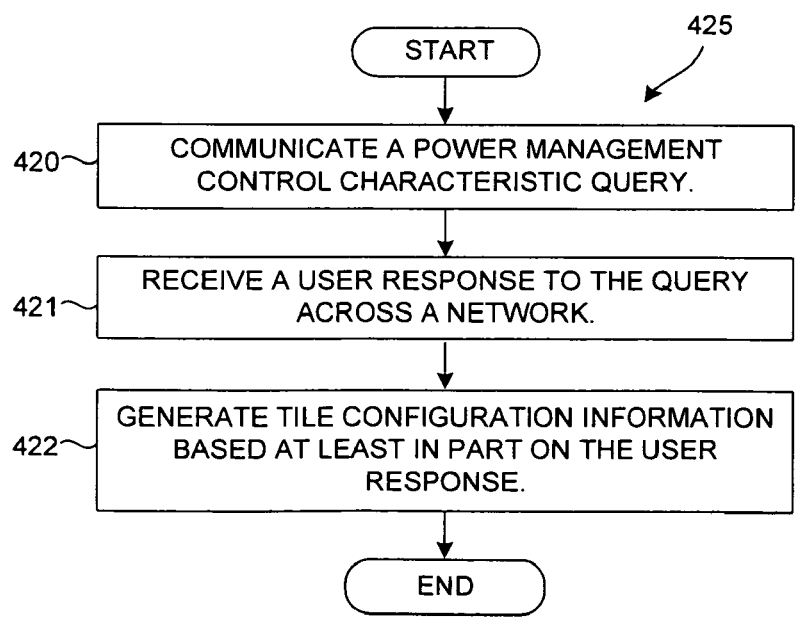
FIG. 27 is a simplified flowchart of a method of generating tile configuration information in accordance with the novel aspect of FIG. 18.

FIG. 27 is a flowchart of a method 425. A power management control characteristic query is communicated (step 420). A user response to the query is received (step 421) across a network. Tile configuration information is generated (step 422) based at least in part on the user response. Steps 420-422 are performed by the ATSPCP tool 46.

Figure 28:
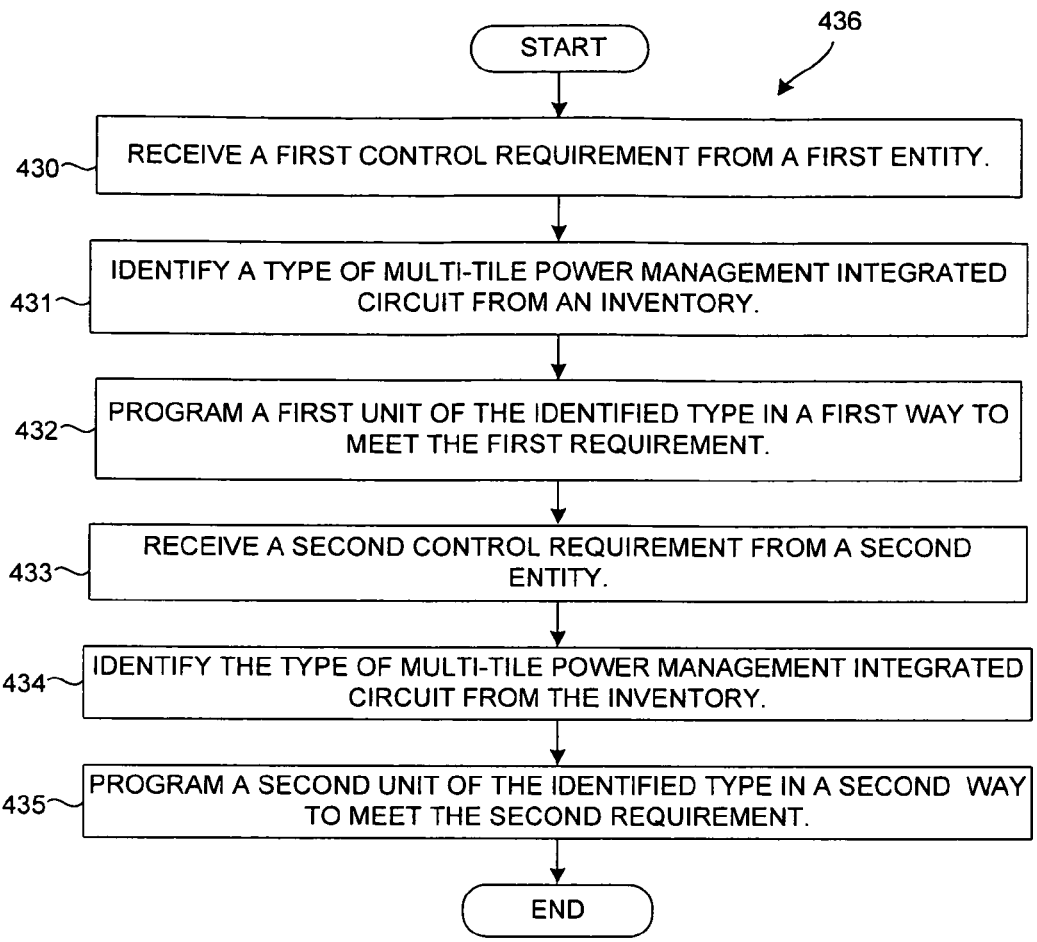
FIG. 28 is a simplified flowchart of a method of programming two units of a MTPMIC of the same type in two different ways in accordance with the novel aspect of FIG. 21.

FIG. 28 is a flowchart of a method 436. A first control requirement is received (step 430) from a first entity. A type of MTPMIC is identified (step 431) from an inventory of already-fabricated MTPMICs. A first unit of the identified type is programmed (step 432) in a first way to meet the first control requirement. A second control requirement is received (step 433) from a second entity. The same type of MTPMIC identified in step 431 is identified (step 434) from the inventory of already-fabricated MTPMICs. A second unit of the identified type is programmed (step 435) in a second way to meet the second requirement. In some examples, the inventory is actual-stock on hand. In other example, the inventory is a projection of available parts to be manufactured. In one example, steps 430-435 are performed by a company such as a fabless semiconductor company or supply house or distributor, and the first and second entities are customers of the company. The company uses the ATSPCP tool 46 to determine how to program the first and second units.

Figure 29:
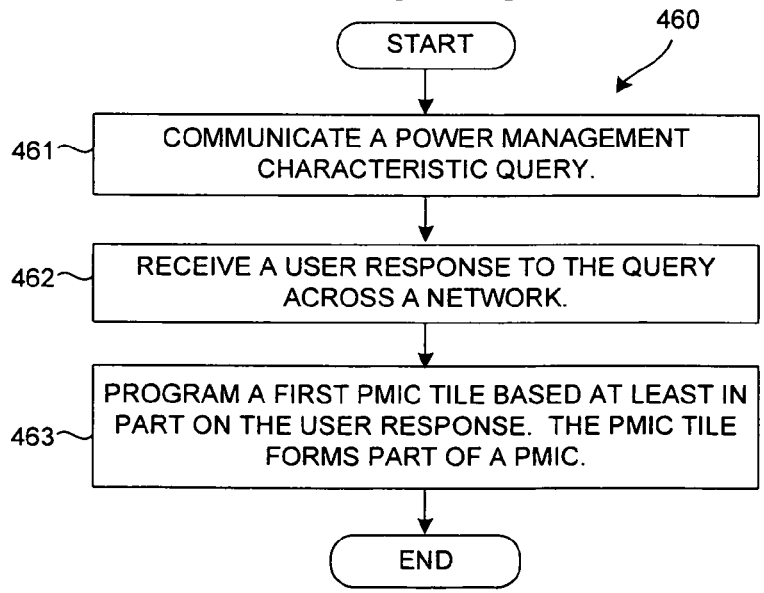
FIG. 29 is a simplified flowchart of a method of programming a PMIC tile in accordance with the novel aspect of FIG. 21.

FIG. 29 is a flowchart of a method 460. A power management characteristic query is communicated (step 461). A user response to the query is received (step 462) across a network. A first PMIC tile is programmed (step 463) based at least in part on the user response. The PMIC tile forms part of a power management integrated circuit.

Figure 30:
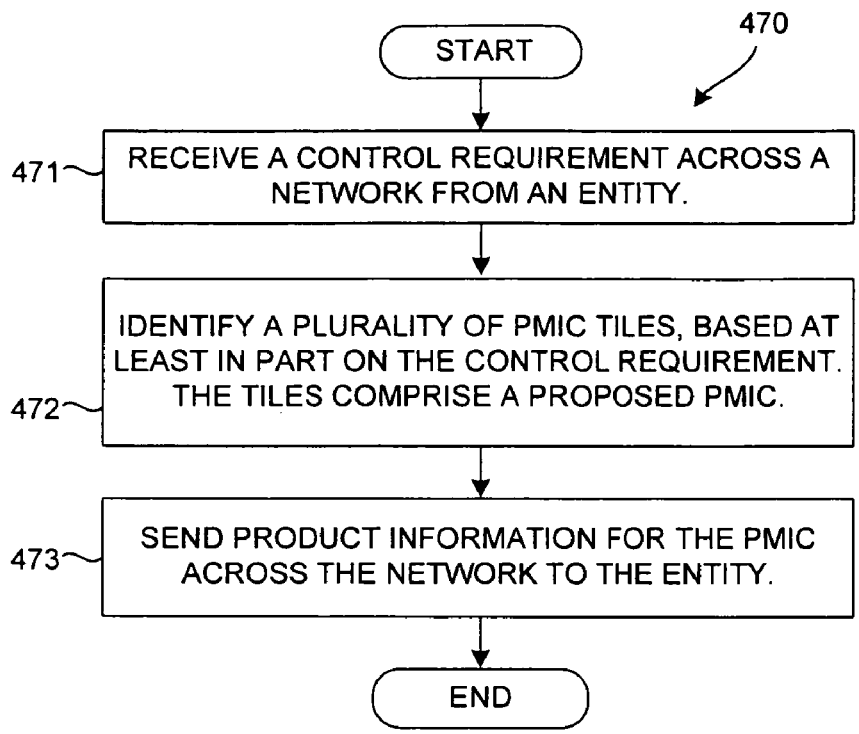
FIG. 30 is a simplified flowchart of a method of identifying a proposed PMIC and sending product information for the proposed PMIC.

FIG. 30 is a flowchart of a method 470. A control requirement is received (step 471) from an entity across a network. In response, a plurality of PMIC tiles is identified (step 472) based at least in part on the control requirement. The tiles comprise a proposed PMIC. Product information is sent (step 473) across the network to the entity regarding the proposed PMIC. Steps 471-473 are performed by the ATSPCP tool 46.

Figure 31:
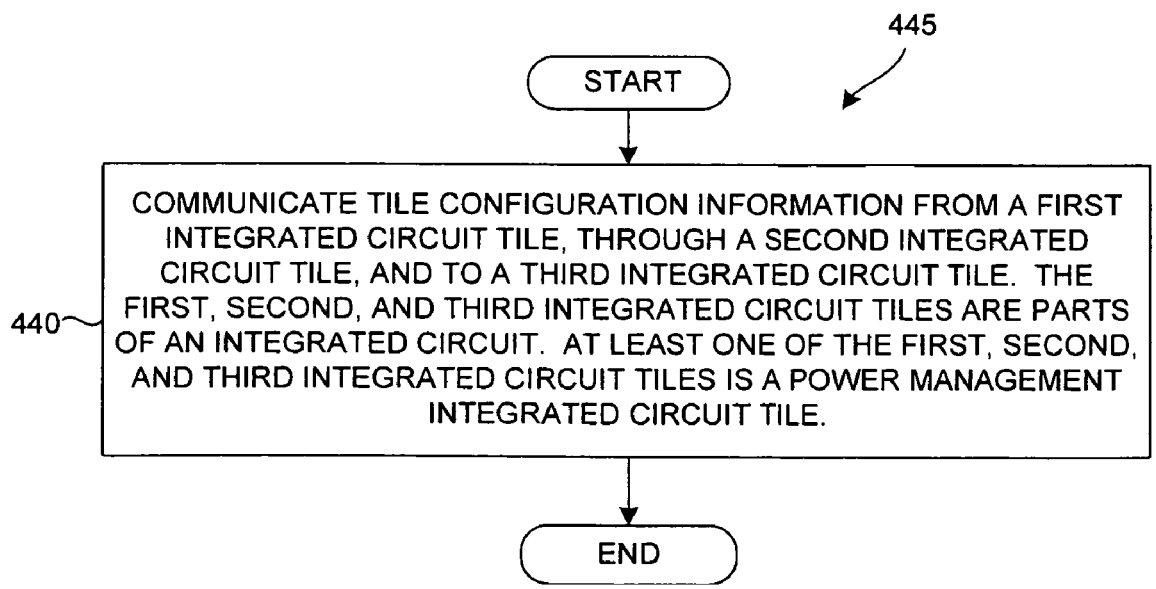
FIG. 31 is a simplified flowchart of a method of communicating tile configuration information in accordance with the novel aspect of FIG. 22.

FIG. 31 is a flowchart of a method 445. Tile configuration information is communicated (step 440) from a first integrated circuit tile, through a second integrated circuit tile, and to a third integrated circuit tile. The first, second, and third integrated circuit tiles are parts of a MTPMIC. At least one of the first, second, and third integrated circuit tiles is a power management integrated circuit tile.

In the described embodiments, a communication from any of the novel tools to an entity may be over a network such as the Internet or a LAN. However content may also be communicated to an entity from a display rendering content generated by any of the novel tools executed directly on the computer connected to the display. An entity may, for example, be a prospective customer, a user, a corporation, or any individual or group associated with a corporation. In the described embodiments, a webpage is used to communicate information. However, information may also be communicated over a plurality of webpages.

With a comprehensive tile library comprising production ready, proven designs, PMICs may be put together without the need for traditional design validation, without circuit simulation, and without DRC/LVS physical design verification. It should be clear that the foregoing embodiments provide a substantially different approach from conventional design methodologies (e.g., analog/digital standard IP libraries, etc.) at least in that the tiles of the preferred embodiment are of fixed sizes or of approximately fixed sizes, are programmable analog/mixed-signal tiles, and are dimensioned and provided with ports to enable the smallest solution size and fastest time-to-market. For example, in one implementation instance of the preferred embodiment, all of the tile length and width dimensions are multiples of approximately 0.5 millimeter with 0.5 millimeter I/O terminal pitch, as shown in FIG. 3, with standard power, communication, and control buses, which automatically link up when the tiles are placed together. In this way, it is possible to very rapidly and easily put together a highly integrated Power Management Integrated Circuit, at least because the tile library is already set up with these efficiencies in mind.

Although certain specific exemplary embodiments are described above in order to illustrate the invention, the invention is not limited to the specific embodiments. Although an ATSPCP tool is described above that performs tile selection, placement, configuration, and programming functions, an ATSPCP tool need not perform all of these functions or even have a capability of performing all these functions. For example, a user can use an ATSPCP tool to perform tile selection and placement operations. Once the placement is finalized, a second ATSPCP tool can be used to determine the configuration information and to program actual parts in inventory or to generate composite physical layout data for fabricating a satisfactory MTPMIC. Dongle 50 can be used to program MTPMICs at a central location where computer 30 is located such that the resulting programmed MTPMICs are then shipped to individual users. Alternatively, an individual user may use a dongle to program MTPMICs at the user's remote location. The dongle may be, but need not be, connected to the same computer that executes ATSPCP 46. Accordingly, various modifications, adaptations, and combinations of various features of the described embodiments can be practiced without departing from the scope of the invention as set forth in the claims.

What is claimed is:

1. A method comprising:
   (a) sending a power management characteristic query across a network;
   (b) receiving a user response to the query from across the network; and
   (c) selecting a first power management integrated circuit tile based at least in part on the user response of (b) by using a computer, wherein the first power management integrated circuit tile is a member of a group of power management integrated circuit tiles and includes a first bus portion, wherein a second power management integrated circuit tile of the group includes a second bus portion, and wherein the first bus portion and the second bus portion connect to form a standardized bus if the first power management integrated circuit tile and the second power management integrated circuit tile are disposed adjacent one another in an integrated circuit layout.

2. The method of claim 1, wherein the power management characteristic query is taken from the group consisting of: a solicitation for input voltage information, and a solicitation for output voltage information.

3. The method of claim 1, further comprising:
   (d) selecting the second power management integrated circuit tile based at least in part on the user response of (b); and
   (e) sending a representation of the first power management integrated circuit tile and the second power management integrated circuit tile disposed adjacent one another across the network.

4. The method of claim 1, further comprising:
   (d) sending a representation of the first power management integrated circuit tile across the network.

5. The method of claim 1, further comprising:
   (d) sending a representation of the first power management integrated circuit tile and the second power management integrated circuit tile disposed adjacent one another across the network.

6. The method of claim 1, wherein the first power management integrated circuit tile is taken from the group consisting of: a buck converter tile, a boost converter tile, a low dropout regulator tile, a linear regulator tile, a battery charger tile, a charge pump tile, a battery and power path management tile, a switching power controller tile, and a lighting control module tile.

7. The method of claim 1, wherein the first power management integrated circuit tile is disposed adjacent the second power management integrated circuit tile to form a multi-tile integrated circuit.

8. The method of claim 7, wherein the multi-tile integrated circuit comprises a light management unit (LMU).

9. The method of claim 7, wherein the multi-tile integrated circuit comprises a power management unit (PMU).

10. The method of claim 7, wherein the multi-tile integrated circuit comprises an energy processing unit (EPU).

11. The method of claim 1, wherein (a) involves a serving of a webpage, wherein the power management characteristic query is a part of the webpage.

12. The method of claim 1, wherein the power management characteristic query is a solicitation for input source information.

13. The method of claim 1, wherein the power management characteristic query is a solicitation for power output requirement information.

14. The method of claim 1, wherein the network is the Internet.

15. The method of claim 1, wherein the user response involves an output voltage value entered by a user.

16. The method of claim 1, wherein the user response involves an output voltage value selected by a user.

17. A method comprising:
(a) communicating a power management characteristic query;
(b) receiving a user response to the query from across a network; and
(c) selecting a first integrated circuit tile based at least in part on the user response of (b) by using a computer, wherein the first integrated circuit tile is a member of a group of integrated circuit tiles and includes a first bus portion, wherein a second integrated circuit tile of the group includes a second bus portion, and wherein the first bus portion and the second bus portion connect to form a standardized bus if the first integrated circuit tile and the second integrated circuit tile are disposed adjacent one another in an integrated circuit layout.

18. A method comprising:
(a) communicating a power management characteristic query across a network;
(b) receiving a user response to the query from across the network; and
(c) selecting a representation of a first power management integrated circuit tile based at least in part on the user response of (b) by using a computer, wherein the first power management integrated circuit tile is a member of a group of power management integrated circuit tiles and includes a first bus portion, wherein a second power management integrated circuit tile of the group includes a second bus portion, and wherein the first bus portion and the second bus portion connect to form a standardized bus if the first power management integrated circuit tile and the second power management integrated circuit tile are disposed adjacent one another in an integrated circuit layout.

19. The method of claim 18, wherein (c) involves selecting a graphical representation of the first power management integrated circuit tile based at least in part on the user response of (b), wherein the graphical representation includes a rectangle.

20. The method of claim 18, wherein (c) involves selecting a textual representation of the first power management integrated circuit tile based at least in part on the user response of (b).

21. The method of claim 18, wherein (a), (b) and (c) are performed by the computer, and wherein the computer is operatively connected to the network.

22. A set of processor-executable instructions stored on a non-transitory processor-readable medium, the set of processor-executable instructions being for:
(a) sending a power management characteristic query across a network such that the power management characteristic query can be displayed to a user;
(b) receiving a user response to the query from the user from across the network; and
(c) selecting a first power management integrated circuit tile based on the user response of (b), wherein the first power management integrated circuit tile is a member of a group of power management integrated circuit tiles and includes a first bus portion, wherein a second power management integrated circuit tile of the group includes a second bus portion, and wherein the first bus portion and the second bus portion connect to form a standardized bus if the first power management integrated circuit tile and the second power management integrated circuit tile are disposed adjacent one another in an integrated circuit layout.

23. An apparatus comprising:
a network port; and
means for communicating with a network via the network port, for communicating with a user across the network such that a power management characteristic query is displayed to the user, for receiving a user response to the query, and for selecting a first power management integrated circuit tile based on the user response, wherein the first power management integrated circuit tile is a member of a group of power management integrated circuit tiles and includes a first bus portion, wherein a second power management integrated circuit tile of the group includes a second bus portion, and wherein the first bus portion and the second bus portion connect to form a standardized bus if the first power management integrated circuit tile and the second power management integrated circuit tile are disposed adjacent one another in an integrated circuit layout.

24. A method comprising:
(a) serving a webpage, wherein the webpage includes a power management characteristic query;
(b) receiving a user response to the query; and
(c) selecting a plurality of power management integrated circuit tiles based on the user response of (b) by using a computer, wherein the tiles are taken from the group consisting of: a buck converter tile, a boost converter tile, a voltage regulator tile, and a battery charger tile, wherein the plurality of power management integrated circuit tiles includes a first power management integrated circuit tile with a first bus portion, wherein a second power management integrated circuit tile of the plurality includes a second bus portion, and wherein the first bus portion and the second bus portion connect to form a standardized bus if the first power management integrated circuit tile and the second power management integrated circuit tile are disposed adjacent one another in an integrated circuit layout.

25. The method of claim 24, further comprising:
(d) combining physical layout data for the plurality of selected power management integrated circuit tiles thereby forming physical layout data for a multi-tile integrated circuit.

* * * * *